United States Patent
Bhalla et al.

(10) Patent No.: US 11,211,373 B1
(45) Date of Patent: Dec. 28, 2021

(54) DOUBLE-SIDED CHIP STACK ASSEMBLY

(71) Applicant: United Silicon Carbide, Inc., Princeton, NJ (US)

(72) Inventors: Anup Bhalla, Princeton Junction, NJ (US); Francisco Astrera Sudario, Santa Rosa (PH)

(73) Assignee: United Silicon Carbide, Inc., Princeton, NJ (US)

( * ) Notice: Subject to any disclaimer, the term of this patent is extended or adjusted under 35 U.S.C. 154(b) by 0 days.

(21) Appl. No.: 17/181,018

(22) Filed: Feb. 22, 2021

(51) Int. Cl.
*H01L 25/18* (2006.01)
*H01L 23/538* (2006.01)
*H01L 23/00* (2006.01)
*H01L 25/07* (2006.01)
*H01L 23/49* (2006.01)
*H01L 25/00* (2006.01)
*H01L 23/373* (2006.01)

(52) U.S. Cl.
CPC ............. *H01L 25/18* (2013.01); *H01L 23/49* (2013.01); *H01L 23/5385* (2013.01); *H01L 24/37* (2013.01); *H01L 24/40* (2013.01); *H01L 25/071* (2013.01); *H01L 25/074* (2013.01); *H01L 25/50* (2013.01); *H01L 23/3736* (2013.01); *H01L 24/08* (2013.01); *H01L 24/32* (2013.01); *H01L 24/33* (2013.01); *H01L 2224/08145* (2013.01); *H01L 2224/32145* (2013.01); *H01L 2224/32245* (2013.01); *H01L 2224/33181* (2013.01); *H01L 2224/37005* (2013.01); *H01L 2224/40105* (2013.01); *H01L 2224/40145* (2013.01); *H01L 2924/10253* (2013.01); *H01L 2924/10272* (2013.01); *H01L 2924/15747* (2013.01); *H01L 2924/1815* (2013.01)

(58) Field of Classification Search
CPC ..... H01L 25/18; H01L 23/5385; H01L 24/37; H01L 24/40; H01L 25/071; H01L 23/49; H01L 25/50; H01L 25/074; H01L 25/2924; H01L 25/15747; H01L 24/08; H01L 2224/08145; H01L 24/32; H01L 2224/32145; H01L 2224/32245; H01L 24/33; H01L 2224/33181; H01L 2224/37005; H01L 2224/40105; H01L 2924/10253; H01L 2924/10272; H01L 2924/1815; H01L 23/3736; H01L 23/538; H01L 23/00; H01L 23/373
USPC ........................................................ 257/77
See application file for complete search history.

(56) References Cited

U.S. PATENT DOCUMENTS

| | | | |
|---|---|---|---|
| 9,275,926 B2* | 3/2016 | Hable | H01L 23/4334 |
| 2007/0138651 A1* | 6/2007 | Hauenstein | H01L 23/62 257/782 |
| 2014/0284777 A1* | 9/2014 | Otremba | H01L 25/18 257/666 |
| 2015/0221581 A1* | 8/2015 | Tamura | H01L 23/3142 257/676 |
| 2016/0005675 A1* | 1/2016 | Tong | H01L 23/4334 257/675 |
| 2016/0247742 A1* | 8/2016 | Vadhavkar | H01L 23/3675 |
| 2017/0330841 A1* | 11/2017 | Cook | H01L 24/48 |
| 2018/0301398 A1* | 10/2018 | Otremba | H01L 23/49562 |

(Continued)

*Primary Examiner* — Alexander O Williams
(74) *Attorney, Agent, or Firm* — BakerHostetler

(57) ABSTRACT

A chip stack assembly uses a monolithic metallic multilevel connector to both join connections on at different heights on the top sides at the of the chips, and to provide a large, robust connection surface on top of top of the assembly.

20 Claims, 22 Drawing Sheets

(56) References Cited

U.S. PATENT DOCUMENTS

| | | | |
|---|---|---|---|
| 2019/0198423 A1* | 6/2019 | Lam | H01L 23/49827 |
| 2019/0333876 A1* | 10/2019 | Yudanov | H01L 23/5286 |
| 2020/0075529 A1* | 3/2020 | Otsuka | H01L 23/3735 |
| 2020/0105639 A1* | 4/2020 | Valavala | H01L 25/0652 |
| 2020/0126943 A1* | 4/2020 | Joshi | H01L 24/27 |
| 2020/0294883 A1* | 9/2020 | Dede | H01L 23/24 |
| 2020/0303344 A1* | 9/2020 | Manipatruni | H01L 25/0655 |
| 2020/0357752 A1* | 11/2020 | Yazzie | H01L 23/562 |
| 2021/0074628 A1* | 3/2021 | Lee | H01L 21/4842 |
| 2021/0143108 A1* | 5/2021 | Gruber | H01L 21/76802 |

\* cited by examiner

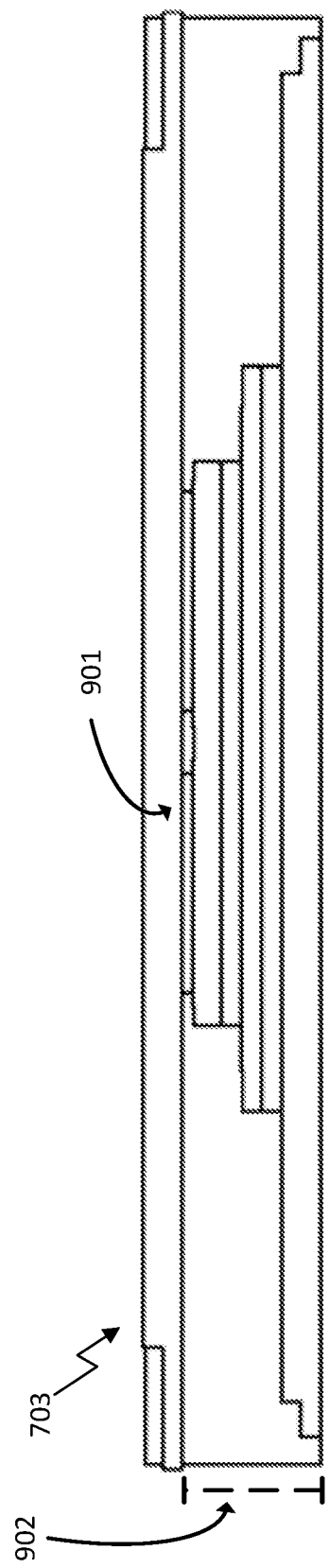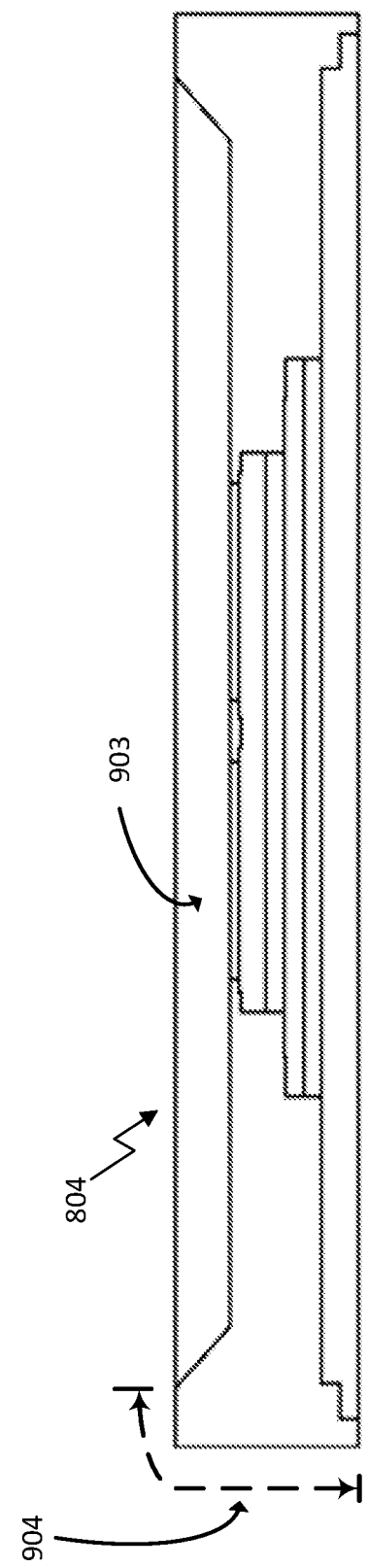

DOUBLE-SIDED CHIP STACK ASSEMBLY

BACKGROUND

This application pertains to the packaging of semiconductor chip stack assemblies including, for example high-voltage and high-current assemblies made with semiconductor devices made of silicon, silicon carbide, and other materials.

SUMMARY

Double-sided chip stack assemblies may be fabricated using interposers and/or multi-level leadframe clips to achieve planarization of topside connections. Such interposers and multi-level clips may provide large bonding areas that are compatible with large bonding wires, such as copper bonding wires, to provide better bonding, better electrical conduction, and better thermal conduction. Alternatively, interposers and/or multi-level clips may be used in forming molded double-sided modules for direct bonding on both top and bottom surfaces in a finished circuit assembly.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to limitations that solve any or all disadvantages noted in any part of this disclosure.

BRIEF DESCRIPTION OF THE DRAWINGS

A more detailed understanding may be had from the following description, given by way of example in conjunction with the accompanying drawings. The drawings are generally not drawn to scale.

FIG. 7A is an exploded view of an example assembly with four chip stacks with exposed side tie bars.

FIG. 7B is an isometric view of four chip stacks in a multi-assembly leadframe structure prior to encapsulation.

FIG. 7C is an isometric view of the structure of FIG. 7B after encapsulation.

FIG. 7D is an isometric view from the top of one of the four chip stack assemblies of FIG. 7C after singulation of the chip stack assembly.

FIG. 7E is a bottom view of unit of FIG. 7D.

FIG. 8A is an exploded view of an example assembly with four chip stacks.

FIG. 8B is an isometric view of the four chip stacks in a leadframe structure prior to encapsulation.

FIG. 8C is an isometric view of the structures of FIG. 8B after encapsulation.

FIG. 8D is an isometric view after grinding the structure of FIG. 8C to expose the copper pads and cut the side tie bars.

FIG. 8E is a top view of a unit from FIG. 8D after singulation.

FIG. 8F is a bottom view of the unit from FIG. 8E.

FIG. 9A is a cross-section of the chip stack assembly of FIG. 7D illustration a side connection to a bottom plan creepage distance.

FIG. 9B is a cross-section of the chip stack assembly of FIG. 8E illustration a side connection to a bottom plan creepage distance.

DETAILED DESCRIPTION

Figure 1A:
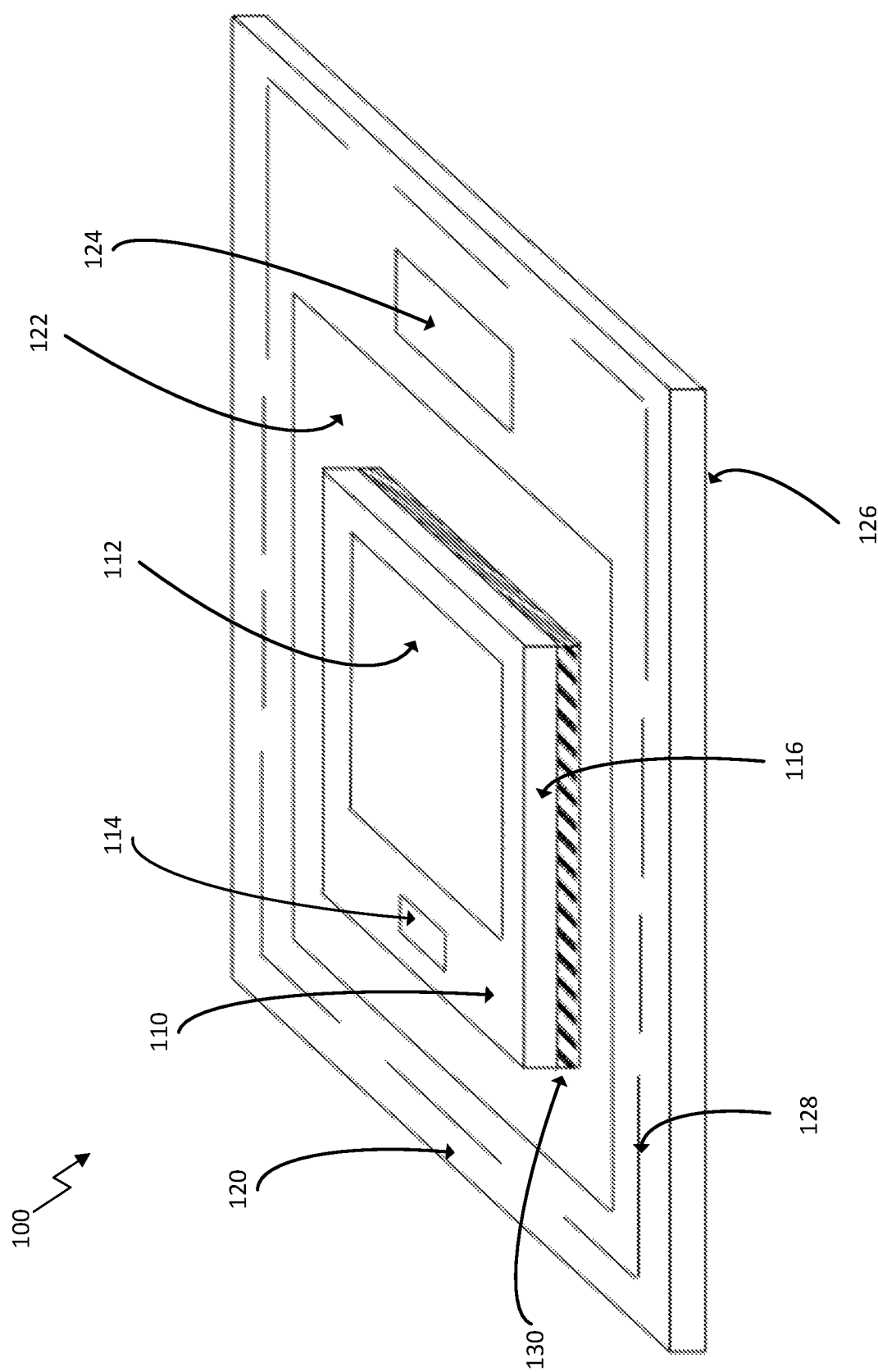
FIG. 1A is an isometric top view of an example chip stack.

Double-sided chip stack assemblies may be fabricated in a variety of ways using interposers and/or multi-level clips to achieve planarization of topside connections. The double-sided chip stack assemblies may be incorporated in circuit assemblies using conventional or improved wire bonding methods. The interposers and multi-level clips may provide large bonding areas compatible with large bonding wires, for example, such as copper bonding wires, to provide better bonding and better electrical and thermal conduction.

Alternatively, interposers and/or multi-level clips may be used in forming molded double-sided modules for direct bonding on both top and bottom surfaces in a finished circuit assembly. For example, double-sided chip stack assemblies may be mounted between two Direct Bond Copper (DBC) ceramic substrates, e.g., with one or more DBC substrate having patterned metallization for connections to various pads on either side of multiple double-sided chip stack assemblies.

These approaches address challenges for lower resistance and better thermal conduction in high-power and/or high-voltage power circuit assemblies, for example. Power devices must often be connected in parallel power modules to achieve a desired current rating and/or to reduce the effective thermal impedance. With the advance of silicon carbide (SiC) technology, especially SiC JFET cascode devices for example, chip sizes are getting much smaller. This poses a challenge for heat removal.

For example, consider a chip stack in a cascode circuit where a low-voltage MOSFET sits atop the source pad of a SiC JFET, and the source pad of the MOSFET chip serves as the source of the cascode power switch. The size of the MOSFET chip and its source pad limit the bonding area for the device. This can limit the current rating of the device, and limit its resilience to power cycling.

Another consideration is that each chip stack should be thoroughly inspected and tested before integration into a larger assembly. Creating chip stack assemblies for integration, rather than directly bonding chip stacks into circuit assemblies, allows for easier testing of the individual chip stack. This in turn reduces the rate of defective power assemblies and the scrap or repair costs associated therewith. Just one defective chip stack can require that an entire circuit assembly module be discarded. Traditionally, performing high-current and high-voltage testing is difficult at the chip level, due to the complexity of handling thin chips. It is difficult to make probe contact without damaging chips, the problem of arcing during a high-voltage test is significant.

Testing of chip stacks in robust-module form avoids difficulties seen when testing bare chip stacks in wafer or singulated form. That is, it is possible to add the top chips of stacks to the bottom chips while the bottom chips are still in wafer form. However, isolating the chips, making connections on multiple planes, and avoiding arcing across the SiC JFET edge termination, for example, are difficult and require specialized equipment.

Further, as technology improves, both the SiC JFET and low-voltage MOSFET chips used in high-power cascode chip stack are being made thinner, to reduce electrical and thermal resistance. This in turn makes the chips increasingly fragile and harder to handle, and makes chip-level high-current and high-voltage testing and inspection more difficult.

Therefore, the production of mechanically robust, knowngood, double-sided chip stack assemblies is desirable, e.g., for all the reasons that known-good-die (KGD) are preferred, but have the added advantage of being compatible with technologies for handling packaged chips and of having the final dielectric materials in place.

The use of double-sided chip stack assemblies is also beneficial because it allows wire bonding to be improved or avoided entirely. Within traditional high-power circuit assemblies, wire bonds are the component most likely to fail due to power cycling over product lifetime. Wire bonding can be improved by using double-sided chip stack assemblies which offer external, topside bonding pads much are much larger than the top bonding pads of the chips in the chip stack. These large pads allow the use of thick and more resilient bonding wires, such as copper bonding wires, as compared to traditional gold or aluminum bonding wires. Similarly, large, topside connection pads allow the use of better cooling methods.

For testing and assembly processing, a chip stack may be incorporated in a chip stack assembly, using one or more interposers and/or a multi-level clip, to form a rugged module. For example, the module may be injection molded in the manner of a chip assembly. It will be appreciated that such techniques may be used to produce modules with all connections on a bottom plane, in the manner of traditional chip assemblies. However, presenting different connections on the top side and bottom side of a double-sided chip stack assembly facilitates easier high-voltage/high-power connections during test, and better and more reliable connections in a finished assembly, as well as better thermal connections.

Example Chip Stack—Cascode

FIG. 1A shows an example chip stack 100 with a smaller chip 110 bonded directly atop a larger chip 120. It will be appreciated that the techniques may be applied to any chip stack. For example, chip stacks created for various purposes may include various combinations of two or more active devices such as BJTs, MOSFETs, JFETs, IGBTs, varistors, diodes, and/or other semiconductor devices made from semiconductor materials, such as silicon, silicon carbide (SiC), gallium arsenide, and/or passive devices such as resistors, fuses, capacitors, etc.

For simplicity, and to highlight some of the advantages of the techniques described herein for chip stacks using group IV and group III-V semiconductors, the examples used herein focus on a high-power cascode chip stack 100 using a low-voltage MOSFET 110 bonded atop a high-power SiC JFET 120. The techniques described herein are useful for achieving higher-power densities and addressing thermal challenges of any chip stack power device. For example, the chip stack assembly packaging techniques described herein in reference to FIGS. 3-9 may be used to achieve better performance, smaller packages, and/or reduced cooling requirements, as compared to prior technologies.

Power chip stacks may operate in any voltage from range, e.g., 10V, 100V, 500V, 1,000V, 10,000V, etc., and in any current range, e.g., 1 A, 10 A, 100 A, 500 A, etc. For example, a cascode comprising a low-voltage MOSFET/SiC JFET may operate in any of these ranges or higher, e.g., from 50 A to 500 A, 600V to 20,000V. Higher amperages and voltages may be achieved, for example, by arranging multiple power chips stack in assemblies. Using the techniques described herein, it is possible to achieve higher current levels per unit area. By addressing thermal conductivity, the technique presented herein reduce thermal cycling stresses of power devices and provide more robust connections, and thereby doubly improving reliability.

In the example of FIG. 1A, the MOSFET 110 has a topside MOSFET source pad 112, and a topside MOSFET gate pad 114. The MOSFET 110 has a backside drain connection 116, which is bonded using material 130 to a topside source pad 122 of the JFET 120. Material 130 may be a solder, adhesive, or the like, that is thermally and electrically conductive. Connections may be secured, e.g., via adhesive, soldering, and/or sintering.

JFET chip 120, in addition to the topside JFET source pad 122 has a topside JFET gate pad 124. The JFET chip has a backside drain connection 126, and an edge termination region 128.

Figure 1B:
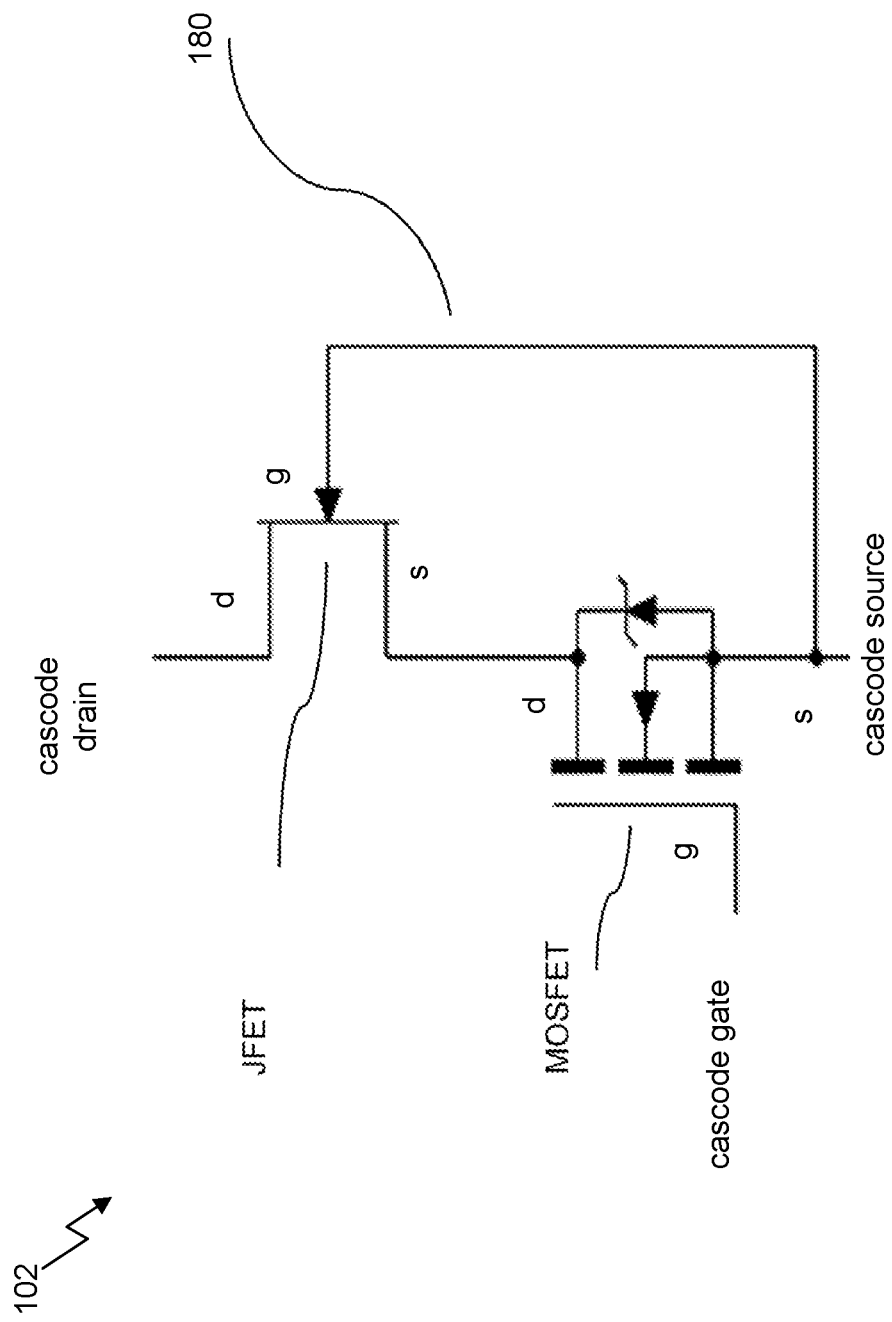
FIG. 1B is an electrical schematic of an example cascode circuit that may be made using a chip stack.

FIG. 1B shows a schematic of an example cascode 102 that may be made using a chip stack such as chip stack 100 of FIG. 1A. In the example of FIG. 1B, the gate of a MOSFET serves as the gate of a normally-off cascode, and the drain of the JFET serves as the drain of the cascode. The chip stack 100 of FIG. 1A has no connection between the source 112 of the MOSFET 110 and the gate 124 of the JFET 120. The cascode 102 of FIG. 1B, however, has a connector 180 that joins the gate of the JFET to the source of the MOSFET. Such a connection may be made in a variety of ways, depending on how a chip stack is incorporated into a circuit assembly. In the circuit of FIG. 1B, the normally-off cascode 102 is controlled by a voltage applied to the gate of the MOSFET.

Traditional Power Module

Figure 2A:
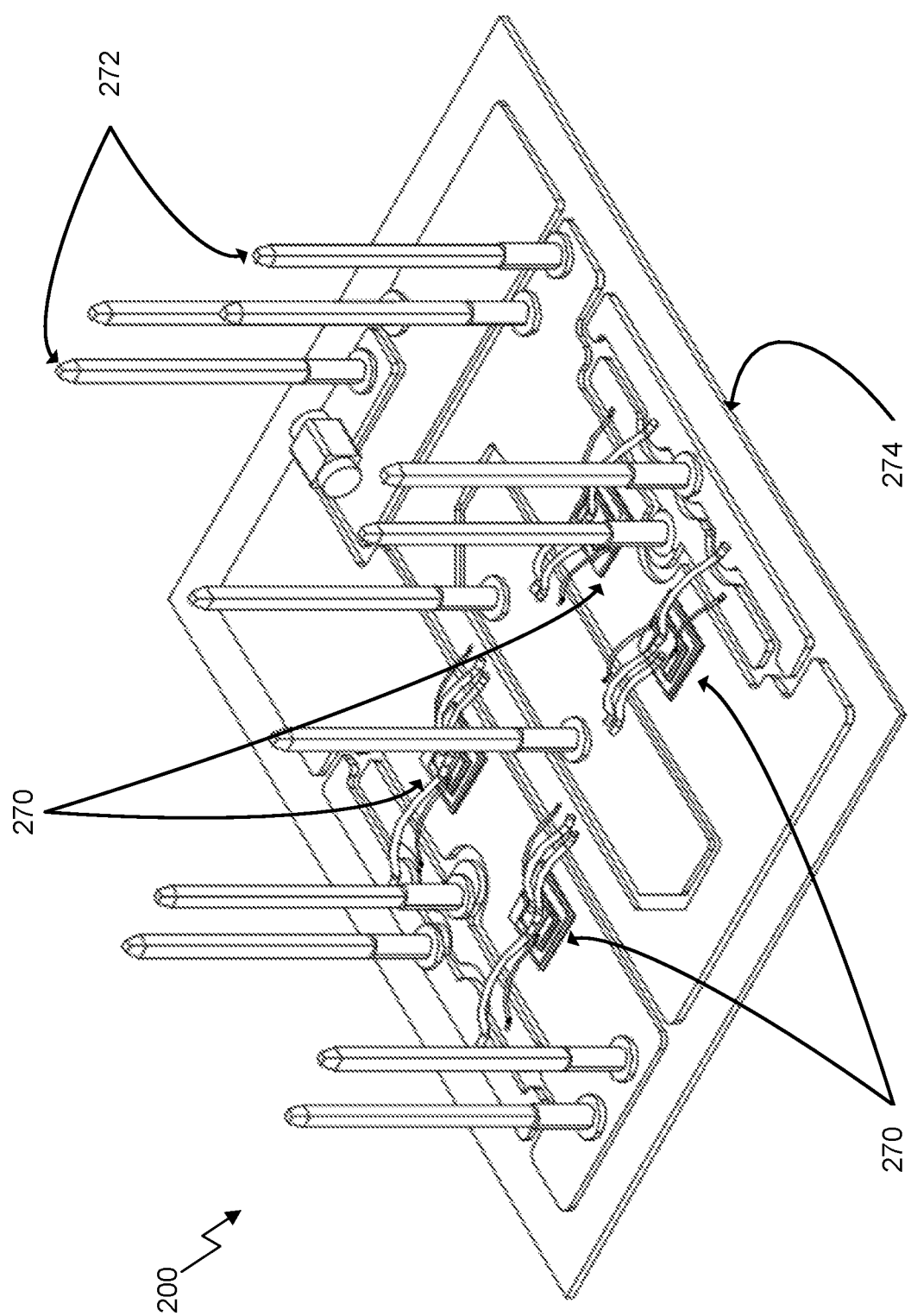
FIG. 2A is an isometric top view of an example module that includes four cascode chip stack assemblies that are connected in parallel on a substrate using wire bonds.

FIG. 2A shows an example traditional power circuit assembly 200 that has four chip stacks 270 on a circuit substrate 274 along with various other components including multiple connection pins 272. Such a circuit assembly is typically inverted for installation, with the pins inserted into a vias of a printed circuit board, and with a heat sink fastened to the back side of the substrate 274.

Figure 2B:
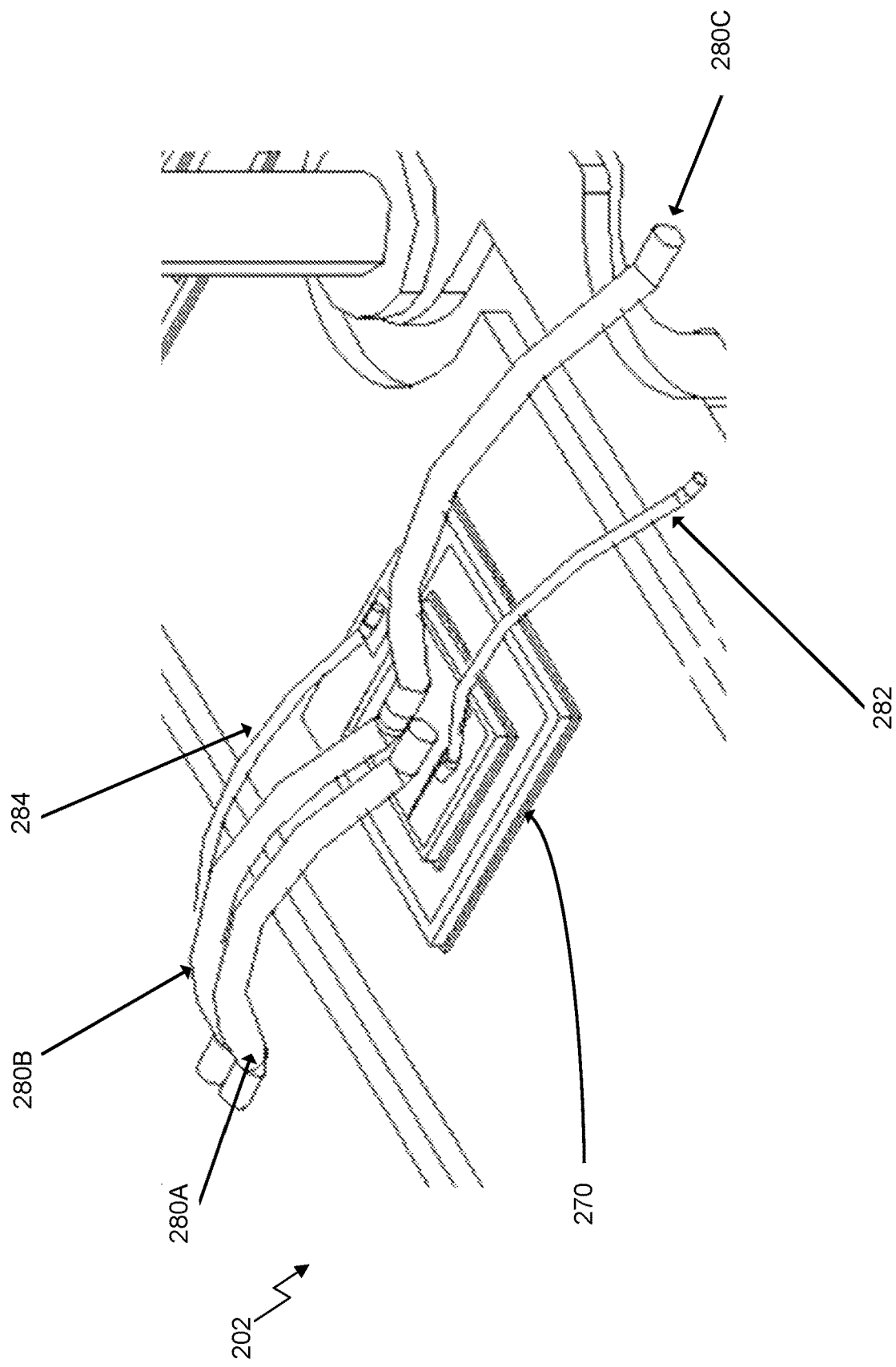
FIG. 2B is a closer view of the wire bonding of a cascode chip stack in situ on the module of FIG. 2A.

FIG. 2B shows an enlarged view of a portion 202 of the assembly 200 of FIG. 2A, including the connections of one of the chip stacks 270. For purposes of discussion, the chip stacks 270 of FIG. 2A and FIG. 2B are assumed to be similar to that of chip stack 100 of FIG. 1A. In FIG. 2B, the bottom connection of chip stack 270 is bonded directly to a conductive trace of the substrate 274. One bonding wire 284 is run to the gate of the bottom JFET chip, and another bonding wire 282 is run to the gate of the top MOSFET chip. Three connections 280A-C are made to the source of the MOSFET. Connections 280B and 280C may be a single wire with the distal ends bonded to conductive traces of the substrate 274, and the middle of the wire "stitched" down with a bond on the source of MOSFET. Connections 280A and 280B carry the source current. In the example of power module 200, bond wire 280C is used for a source kelvin connection. The separate kelvin source connection is made along a non-current-bearing pathway for more accurate measurement of voltage conditions at the chip stack 270.

Traditionally, copper wire is not used for bonding high-power chip stacks. This is because, for example, a thick (e.g., >10 to 25 μm) copper plating, or a copper plate sintered in place, would be required on the source pad of the low-voltage MOSFET. In traditional practice, non-copper connections are used which, relative to copper wire, results in increased resistance and reduced reliability. Similarly, thinner gauges of bonding wire are normally used, as compared to the larger copper wires made possible by copper plating or a copper plate, and this again leads to increased resistance and reduced reliability.

Double-Sided Chip Stack Assembly with Interposer

Figure 3:
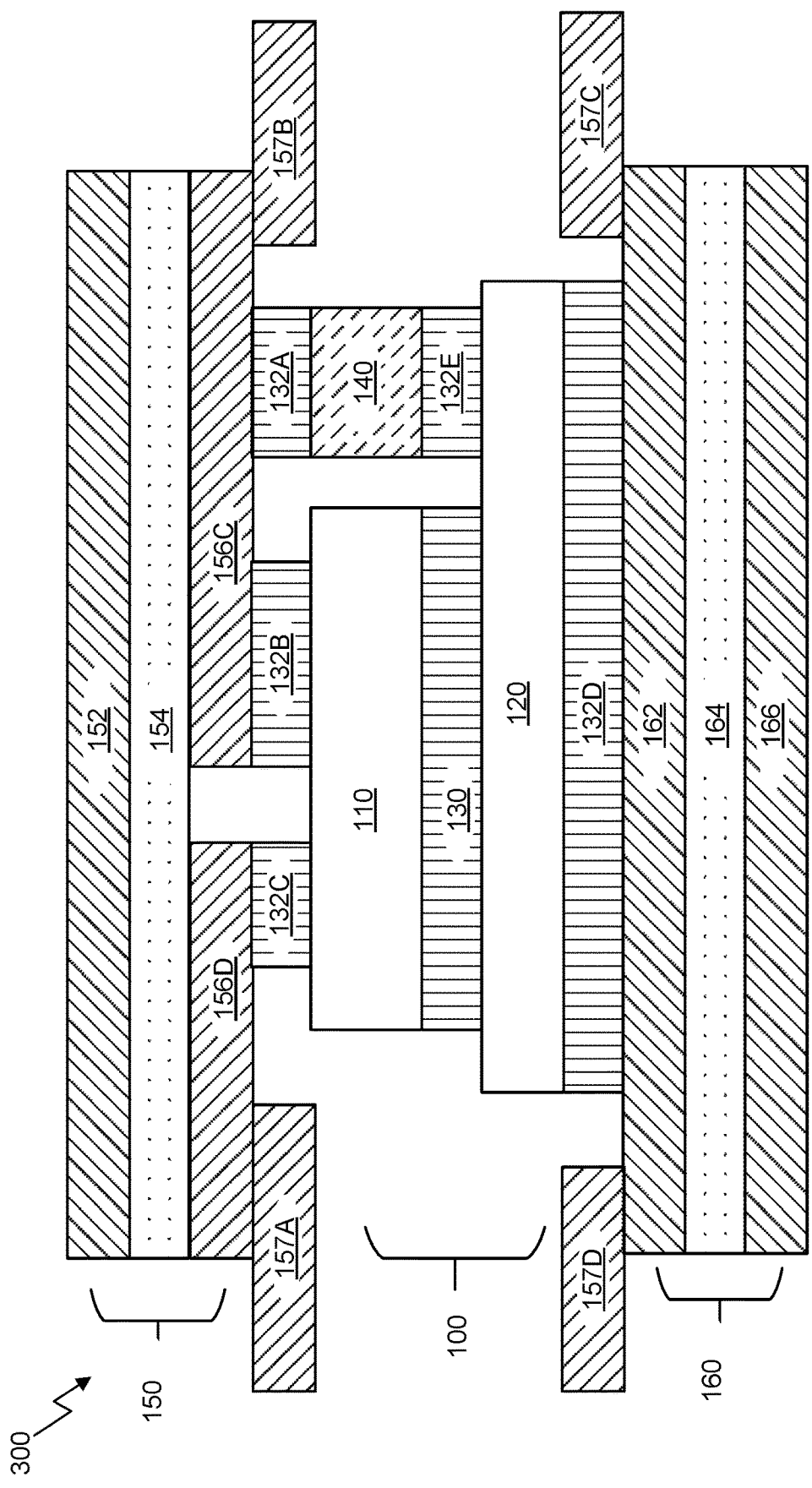
FIG. 3 is a vertical cross-section of an example chip stack assembly formed without wire bonds using an interposer.

FIG. 3 shows a vertical cross-section of an example double-sided chip stack assembly 300 made using an interposer structure 140. For purposes of illustration, the module 300 includes the chip stack 100 of FIG. 1A connected as a cascode as illustrated in FIG. 1B. The bonding pads of the MOSFET 110 and JFET 120 are not shown in FIG. 3 per se. Connections of the chip stack 100 are indicated by the bonding materials 130 and 132A-E. The backside drain of MOSFET 110 is bonded to the topside source of JFET 120 by bonding material 130. Bonding material 132D connects the backside drain of JFET 120 to a conductor 162 of a bottom direct-bond-copper (DBC) substrate 160. Substrate 160 has a ceramic core 164, and an outer conductor layer 166 which may be connected to the cascode drain conductor 162, for example, by vias. In the example of FIG. 3, connections to the drain of the chip stack 100 are provided by conductor tabs 157C and 157D, which allows outer layer 166 to be isolated.

The topside connections of the MOSFET 110, including the MOSFET source and gate connections are made to conductive traces 156C and 156D, respectively, of top DBC substrate 150. This is achieved using bonding materials 132B and 132C, respectively. Substrate 150 has a ceramic core 154 and an external conductor 152 which may be connected to the cascode source by vias, or left isolated. In the example of FIG. 3, the cascode gate connection is available via a conductor tab 157A, and the cascode source connection is available via conductor tab 157B. Other connections of the cascode may be exposed on the planes of conductors 166 and/or 152 in areas not shown in the cross-section of FIG. 3.

The gate pad of the JFET 120 sits lower than the topside connections of the MOSFET 110. Connection of the gate pad of the JFET 120 to the top substrate 150 may be achieved by the use of an interposer 140, e.g., a small conductive block, that is bonded with material 132E to the gate pad atop JFET 120, and by material 132A to the a source trace 156C on the lower surface of substrate 150.

The configuration of FIG. 3 allows double-sided cooling of the chip stack 100. Further, this configuration avoids the use of wire bonding of the chips, and the limitations associated therewith. The performance of the chip stack assembly 300 may be further improved, for example, by filling or partially filling the gaps with a high-dielectric breakdown material, e.g., to avoid arcing at the edge termination of the JFET 120. Encapsulation may further produce a robust cuboid that may be handled for inspection, test, and/or assembling using conventional packaged chip handling equipment. For example, encapsulated chip stack assemblies may be tested at high currents and voltages without danger of arcing, or damage to the chips, and shipped as known-good-die in, for example, tape-and-reel format.

Double-Sided Chip Stack Assembly with Clip

Figure 4A:
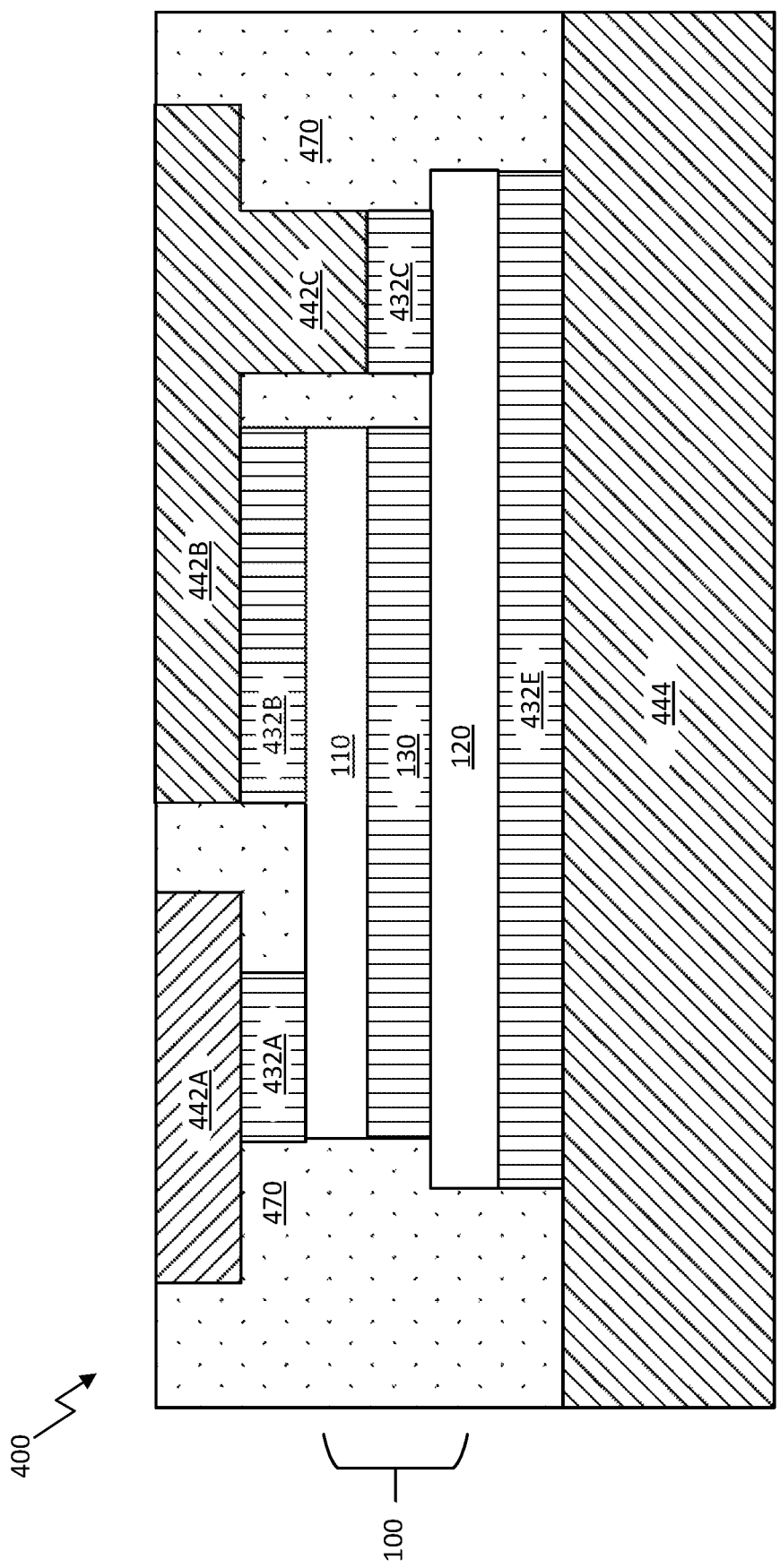
FIG. 4A shows a vertical cross-section of a chip stack assembly made without an interposer using a clip.

FIG. 4A shows a vertical cross-section of an example chip stack assembly 400 made using the chip stack 100 of FIG. 1A and a leadframe elements that may be "clipped" around the chip stack 100 to provide topside and bottom connection surfaces for the assembly 400. As in the Example of FIG. 3, at the core of module 400 is the chip stack 100, in which a top chip MOSFET 110 is bonded with bonding material 130 to a bottom chip JFET 120. In the example of FIG. 4, the backside connection drain of JFET 120 is bonded with bonding material 432E to a heat spreader conductor 444. The topside gate connection pad of the MOSFET 110 is bonded by bonding material 432A to a topside gate connection conductor 442A. The topside source connection pad of MOSFET 110 is are bonded with bonding material 432B to a portion of a multilevel connector source conductor 442B. The topside gate connection pad of the JFET 120 is bonded with bonding material 432C to a lower portion of the multilevel connection conductor region 442C, which is a portion of the multilevel connector 442B. Note that the connections of the multilevel connector 442B and 442C are made at different heights. The assembly is completed by the addition, e.g., via injection molding, of a dielectric encapsulant 470 to fill the gaps in the assembly. High-quality encapsulants may be used for dielectric 470 to ensure excellent power cycling reliability, as well as resistance to moisture incursion or other environmental effects, while also protecting the JFET termination from arcing risk.

Conductor 444 may be a thick copper heat spreader, e.g., 100 μm to 3 mm or more in thickness, that is soldered or sintered to the backside drain connection of the JFET 120. Conductor 444 may be discrete, or, at the time of initial assembly, it may part of a bottom leadframe on which several modules 400 are constructed at the same time.

Similarly, conductors 442A and 442B/442C may be portions of a top leadframe that is applied to a chip stack 100 or an array of chip stacks 100 that are assembled into modules 400 at the same time. Note that conductor 442B has a portion 442C that extends further down that conductor 442A, to accommodate the difference in heights of the topside connections of the MOSFET 110 and JFET 120. Conductors 442A and 442B, including portion 442C, may be rigid, cast parts. Alternatively, one or more portions, such as portion 442A-C, may be spring-like members, to facilitate good connections despite variations in the actual height differences.

Further, leadframes implementing the top conductors 442A-C and bottom conductor 444 may be parts of a clip adapted to be attached around a chip stack 100, or a groups of chip stacks 100 in singulated chip, wafer, or partial wafer forms. That is, in the case of a singulated chip stacks, a chip stack may be enclosed and bonded in a clip, then injection molded with a dielectric 470, and then have portions of the clip trimmed away. Unwanted parts of the leadframe can be removed by grinding, etching, or laser removal. Similarly, singulation may be done by two-stage sawing, grinding, laser, or etching.

For a wafer or a portion of a wafer comprising an array of chip stacks 100, a clip comprising an array of conductors 442A-C and conductors 444 may be clipped and bonded around the array of chip stacks 100, and the resulting assembly may be provided with void-filling dielectric 470, e.g. by injection molding or other means. Chip stack assemblies 400 may then by singulated, e.g., cutting them away from the array, before or after testing.

In contrast to the design of FIG. 3, the chip stack assembly 400 of FIG. 4 has top and bottom connections directly on the top and bottom surfaces, without intervening ceramic layers, and is thinner. Nonetheless, like the design of FIG. 3, it is a robust cuboid. The chips are not exposed mechanically or environmentally.

Figure 4B:
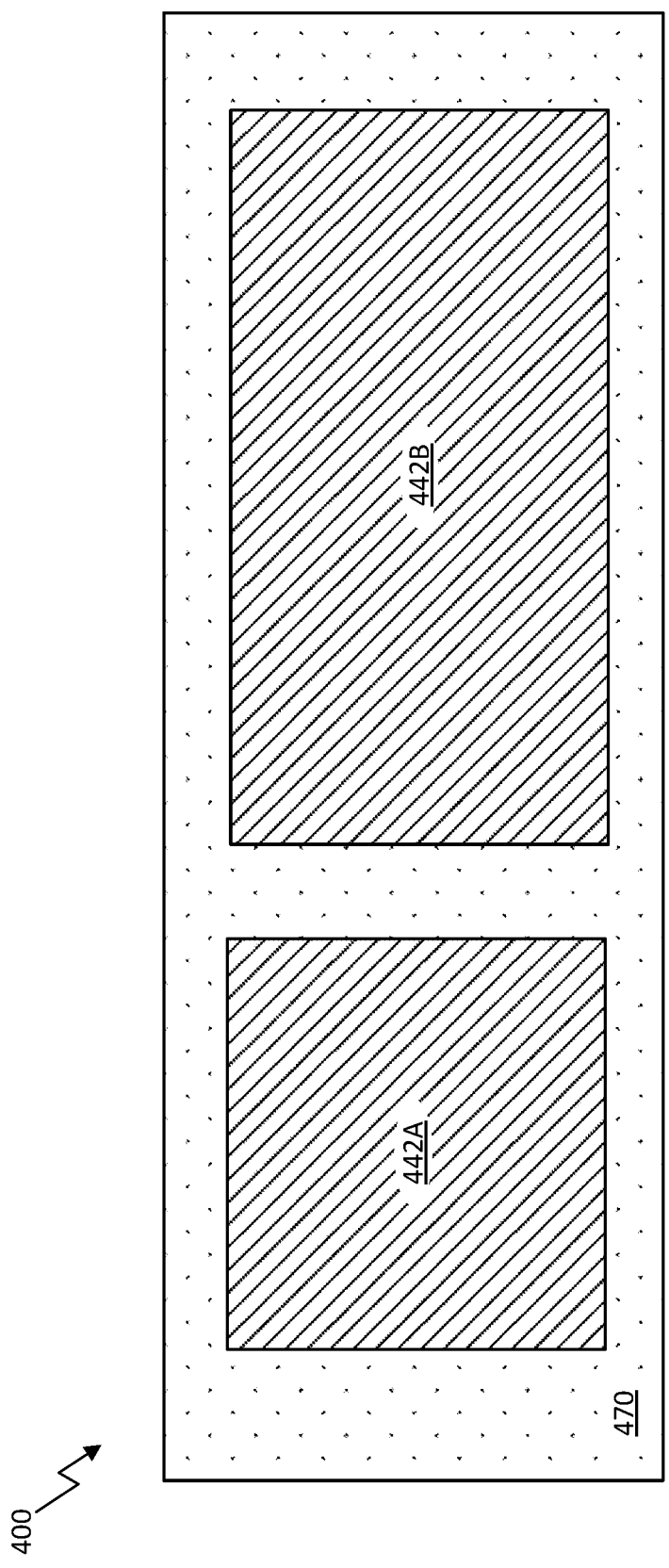
FIG. 4B shows a top view of the connections atop the assembly of FIG. 4A.

Further, the topside connections can be made much larger than the chip topside bonding pads. FIG. 4B shows a top view of assembly 400 of FIG. 4A. Chip stack assembly 400 may be used as a direct replacement for bare chip stacks, with better connections and easier testing and handling. For example, as compared to a bare chip stack 100, a chip stack assembly 400 may have exposed topside gate and source connections which are larger than the chip bonding pads, or even larger than the chips themselves. Further the exposed top- and bottom-side connections of a chip stack assembly may be copper, e.g., for ready soldering and/or copper wire bonding.

Using a heat spreader as conductor 444, such as a copper heat spreader, and/or using similar materials for conductor 442A-C, has several advantages. For example, bonding a heat spreader directly to the JFET 120 minimizes the thermal resistance seen by JFET 120. Since the thermal resistance of a heat spreader, such as a copper heat spreader, is lower than that of ceramic or thermal interface materials that may otherwise be used, transient and steady state thermal heat transfer area to a heatsink may be greatly improved.

Similarly, the use of copper topside structures allows a much higher current handling capability. These topside structures may be designed to increase the area offered by the top pads to maximize current carrying cross-sectional contact area to structures beyond the chip stack module itself. The wider the copper structures, the greater the current and thermal performance of the device, which in turn may further improve the power cycling lifetime of the device.

It will be appreciated that the conductors described herein as clips, interposers, leadframes, bond wires, bond ribbons, heat spreaders, multilevel connectors, topside connectors, and the like may be implemented with any conductive material, such as, but not limited to metals such as aluminum, silver, gold, and copper, or alloys such as copper alloys, or other materials.

Options for Incorporating Dual-Sided Modules in Larger Assemblies

The chip stack module 400 depicted in FIGS. 4A and 4B is extremely versatile for downstream packaging into more complex power module assemblies. For example, the use of copper or other conductors of sufficient thickness (e.g., 0.1 to 3 mm) on the topside of the structures 442A and 442B allows the use of thick aluminum wire bonds (e.g., 5-20 mils), thick copper wire bonds (e.g., 12-20 mils), copper ribbon bonds (e.g., 2-20 mils, with variable widths to match the top electrode). Similarly, such thick topside structures may be compatible with copper conductor/busbar structures than can be soldered, sintered, strike soldered, ultrasonically welded, laser welded, or brazed to the top connections. These methods cannot be applied directly to the fragile surfaces of the underlying active semiconductor devices. These observations largely also apply to connections to the bottom conductor 444, where, for example, the use of welding and brazing might not be possible directly to the bottom chip.

Another form of contact involves spring-loaded high-pressure contacts. These are often used with arrays of power devices that are installed in parallel. The spring-loaded contacts form reliable joints that are resistant to temperature cycling failure, while allowing dual sided heat removal. The structure of the chip stack module of FIGS. 4A and 4B is very well suited for that purpose. Thus, the structure illustrated in FIGS. 4A and 4B not only facilitates improvements in the matters and thicknesses of bond materials that may be used to incorporate chip stacks into larger assemblies, but also enable the use of packaging technologies not previously applied in constructing high-power, high-current devices resulting in assemblies with previously unseen thermal performance and reliability.

Improved Wire Bonding

Figure 5A:
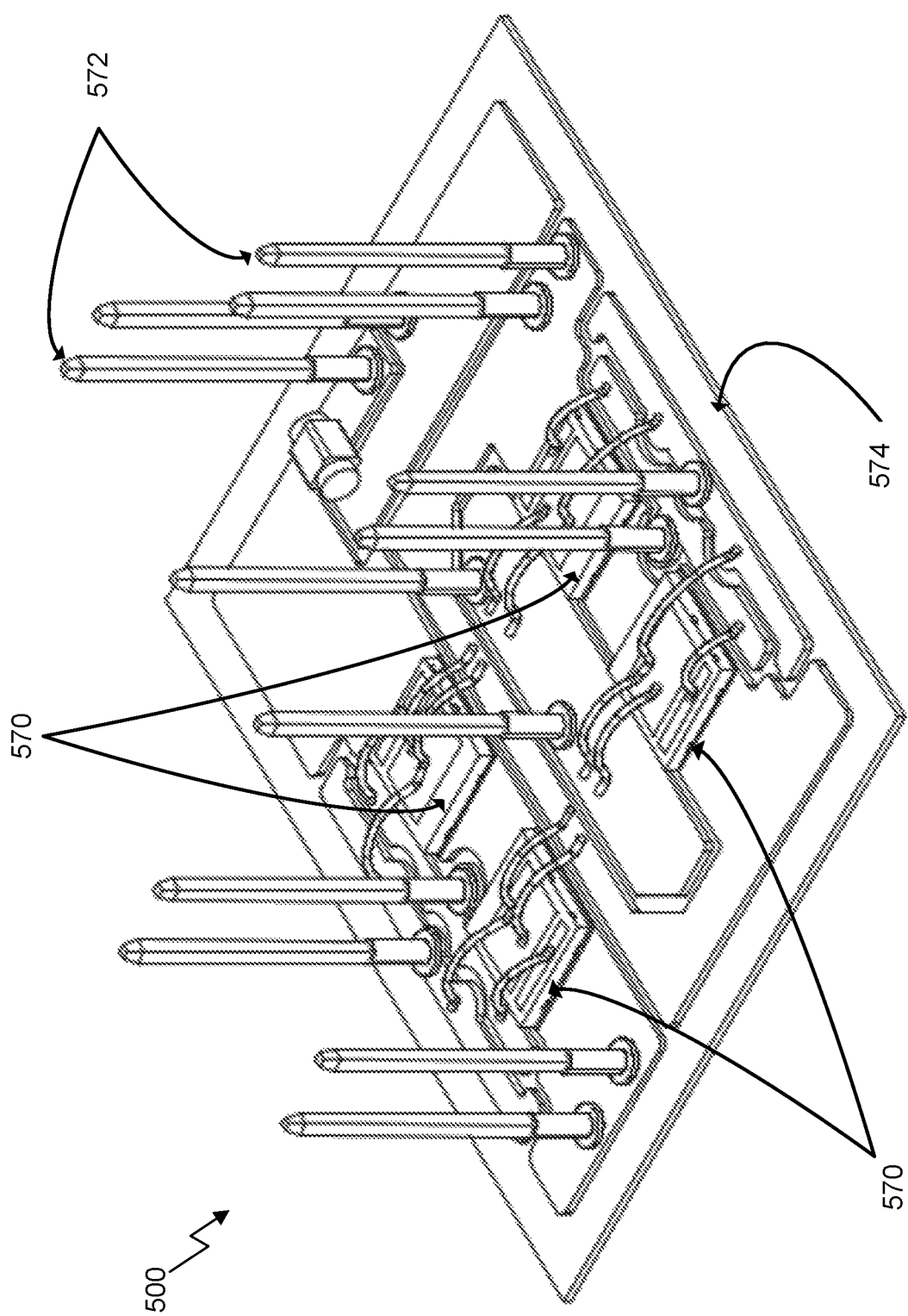
FIG. 5A shows a power module with improved wire bonding using four of the chip stack assemblies of the kind illustrated in FIGS. 4A and 4B.

FIG. 5A shows an example power module 500 made with improved wire bonding using four chip stack assemblies 570. The chip stack assemblies 570 are similar to the four chip stack assembly 400 illustrated in FIGS. 4A and 4B. Like the module 200 of FIG. 2A, module 500 has a substrate 574 and other components, including pins 572.

Figure 5B:
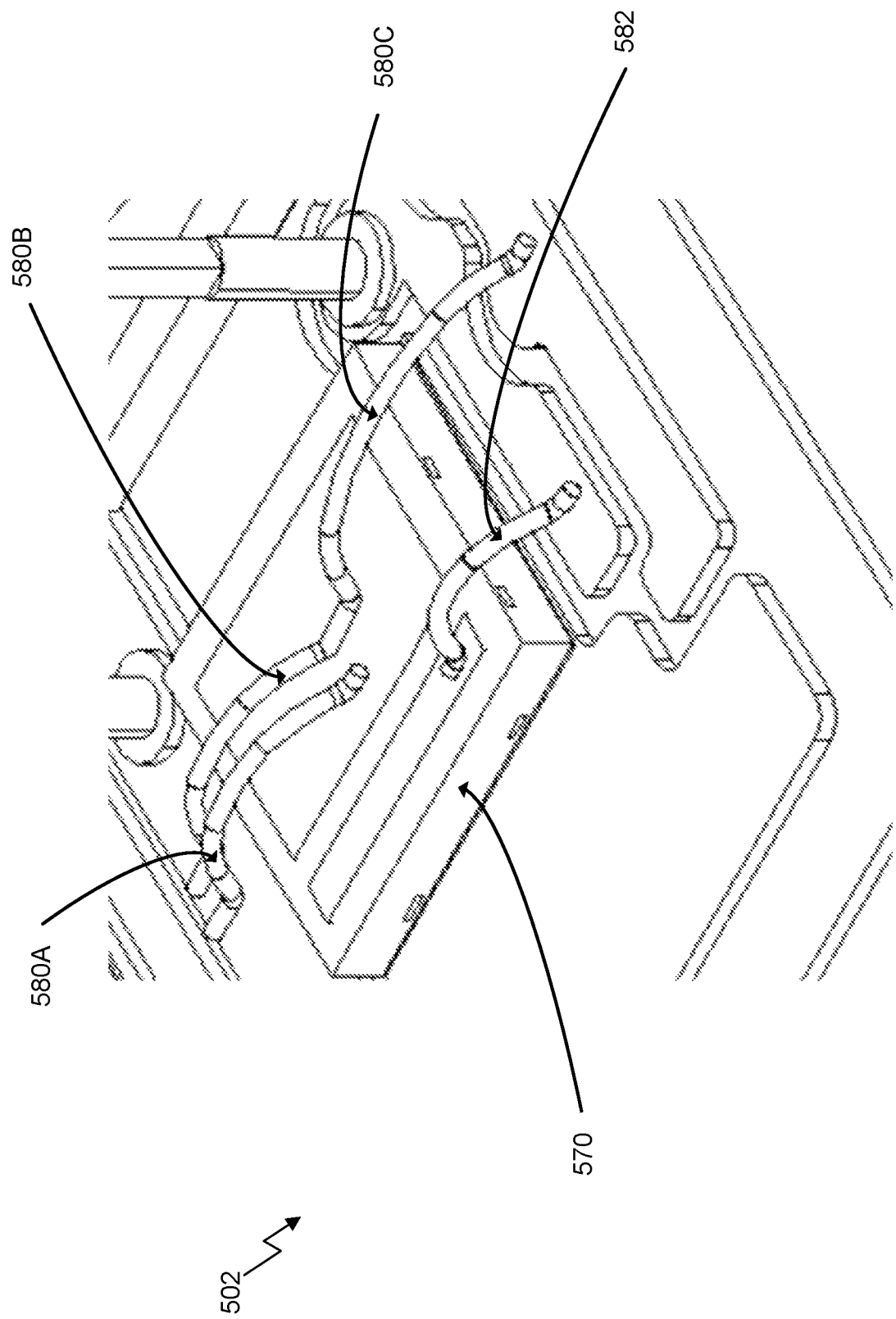
FIG. 5B shows a closer view of the one the chip stack assemblies in the power module of FIG. 5A.

FIG. 5B shows a closer view of the one of the chip stack assembly 570 of FIG. 5A. In FIG. 5B, multiple bond wires 580A, 580B, and 580C connect to the large topside source pad of chip stack assembly 570. Wires 580B and 580C may be separate wires, or a single wire that is stitched to the module in the middle of the wire. The source pad of the chip stack module 570 may be, for example, able to directly receive thick copper wires. In contrast to forming a module using bare chip stacks, the chip stack assembly 570 permits the use of thick copper wire bonding 580A-C to reduce resistance and improve power cycling lifetime in a final power module. Similarly, a larger pad is available for the cascode gate connection 582, and this pad may similarly be copper wire bonded. This provides the opportunity for a single diameter of wire to been used for all connections. In the example of power module 500, bond wire 580C is used for a source kelvin connection, while connections 580A and 580B carry the source current.

Since the source pad of the chip stack assembly 570 is larger than the source pad of the MOSFET within the chip stack assembly 570, more wire bond connections may be made to the chip stack assembly 570 source pad, and thicker bonding wire connections may be used. Similarly, thicker wire may be used for connecting the gate. A separate connection to the JFET gate is not necessary since it is formed within the chip stack module 570. A single gauge of bond wire may be used for all connections.

Bonding to DBC Substrate with Double-Sided Chip Stack Assembly with Clip

Figure 6:
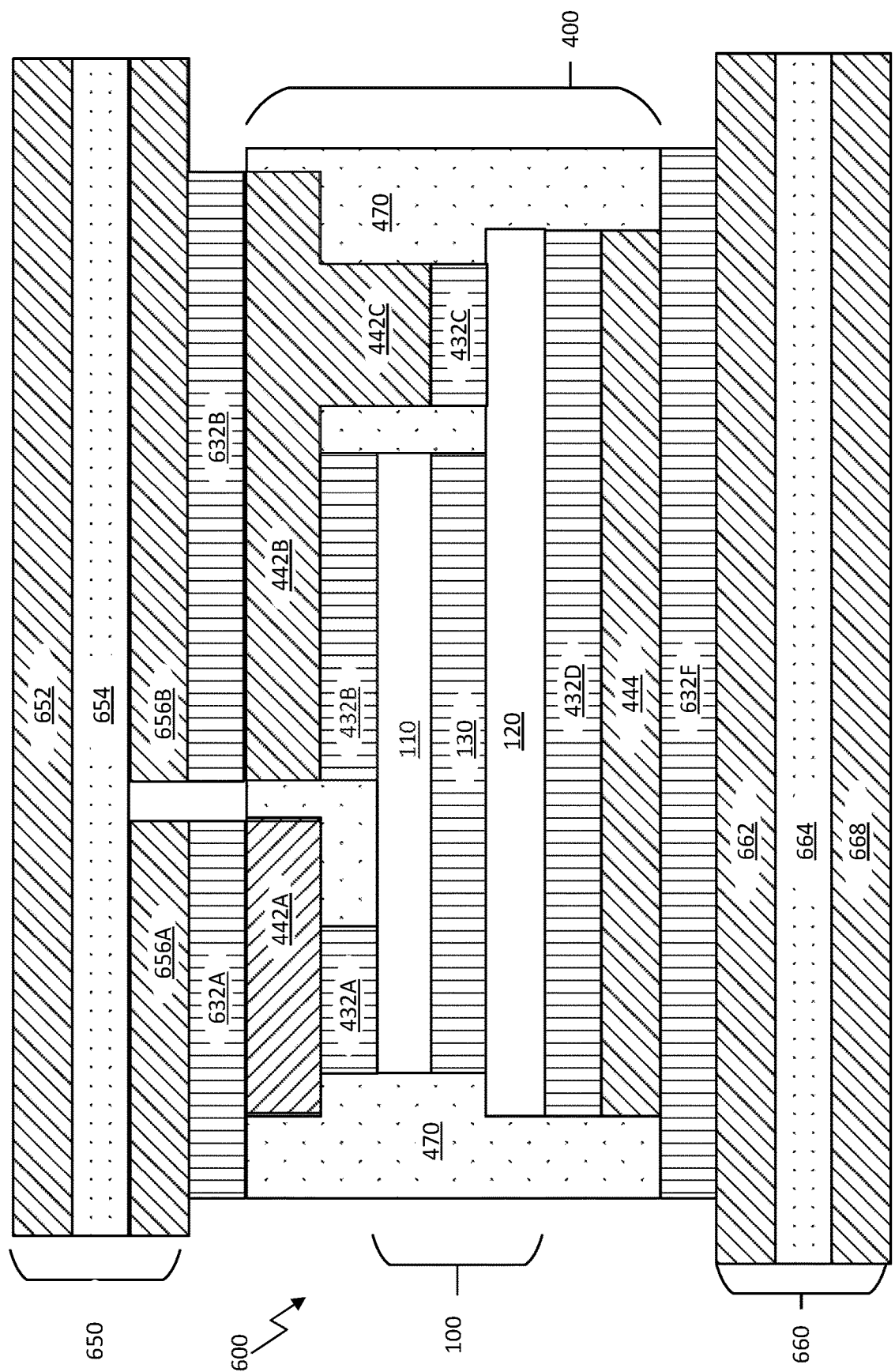
FIG. 6 shows a vertical cross-section of an example power module using the chip stack assembly of the kind illustrated in FIGS. 4A and 4B.

FIG. 6 is a vertical cross-section of an example assembly 600 that includes the chip stack assembly 400 of FIGS. 4A and 4B bonded between two DBC substrates 650 and 660. As described in reference to FIGS. 4A and 4B, the chip stack assembly 400 includes the chip stack 100 FIG. 1A as well as dielectric 470 and conductors 442A-C and 444. Here in FIG. 6, the chip stack assembly 400 is mounted in a double-sided cooling module configuration analogous to that of FIG. 3. In contrast to FIG. 3, the multilevel conductor with portions 442B and 442C obviates the need for a separate interposer 140. In combination with topside conductor 442A, all of the topside connections to be made with a single soldering or sintering operation on a single plane, for example, using bonding materials 632A and 632B to connect to the bottom traces 656A and 656B of top DBC 650. Similarly, a bottom drain connection may be formed by soldering or sintering bottom conductor 444 of chip stack assembly 400 to top conductor 662 of DBC substrate 660 using bonding material 632F. Additional connections, not shown in FIG. 6, may be formed using other traces on the DBC substrates and/or vias through the ceramic cores 654 and 664 of the DBC substrates 650 and 660 respectively. Alternatively, tabs analogous to tabs 157A-D of FIG. 3 may be used for the cascode gate, source, and drain connections.

Example Process with Tie Bars

FIGS. 7A-E show an example process for creating chip stack assemblies such as assembly 400 of FIGS. 4A and 4B. In the example of FIGS. 7A-E, clip leadframe portions closing on the top and the bottom of multiple chip stacks is used. An array of chip stack assemblies are mounted on a lower leadframe portion. An upper leadframe includes a multilevel structure that connects with the top chip of each chip stack at a first height, and with the bottom chip at a second height, while presenting a single connection plane on a top surface of the chip stack assembly. The multilevel connector thus forms the cascode JFET gate to MOSFET source connection. FIGS. 7A-E include a conceptual view as well as the appearance of multi-assembly structures after leadframe attach and molding, and the appearance of assemblies after singulation. In the example of FIGS. 7A-E, the finished chip stack assembly includes gate and source pad copper that reach the side edges, which may be acceptable in lower voltage devices, but may lead to challenges of arcing during test at high voltages.

It will be appreciated that the many of the assembly steps described herein may be performed in a variety of ways and/or in a variety of sequences. For example, chip stacks may be assembled prior to being placed in a leadframe. Alternatively, the lower chip may be bonded into the leadframe first, and then the top chip may be bonded onto the lower chip in situ in the lead frame.

Figure 7A:
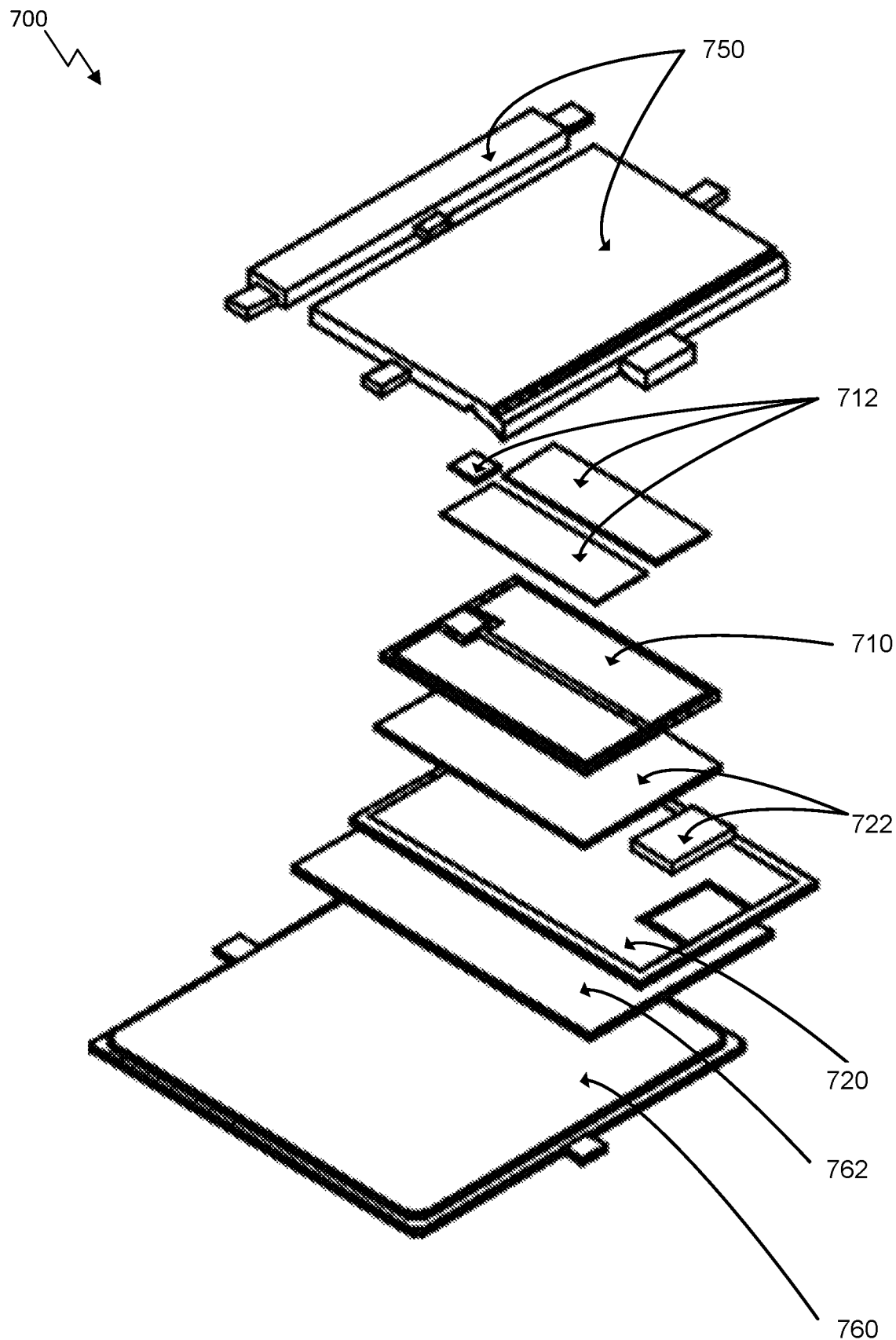
FIGS. 7A-7E illustrate an example process for building an array of chip stack assemblies using clips.

FIG. 7A shows a conceptual exploded view of a single chip stack assembly 700, without encapsulation. Chip stack assembly 700 is analogous to chip stack assembly 400 as described in reference to FIGS. 4A and 4B. On top is a top leadframe portion 750 which will be connected to MOS chip 710 using connection material 712. MOS chip 110 and the top leadframe portion 750 are connected to the JFET chip 720 using connection material 722. The bottom of the JFET chip 720 is connected to a bottom leadframe portion 760 via a connection material 762. The connections in the stack may be achieved as described in reference to FIGS. 4A and 4B, for example, using solders, conductive adhesives, sintering, or the like.

Figure 7B:
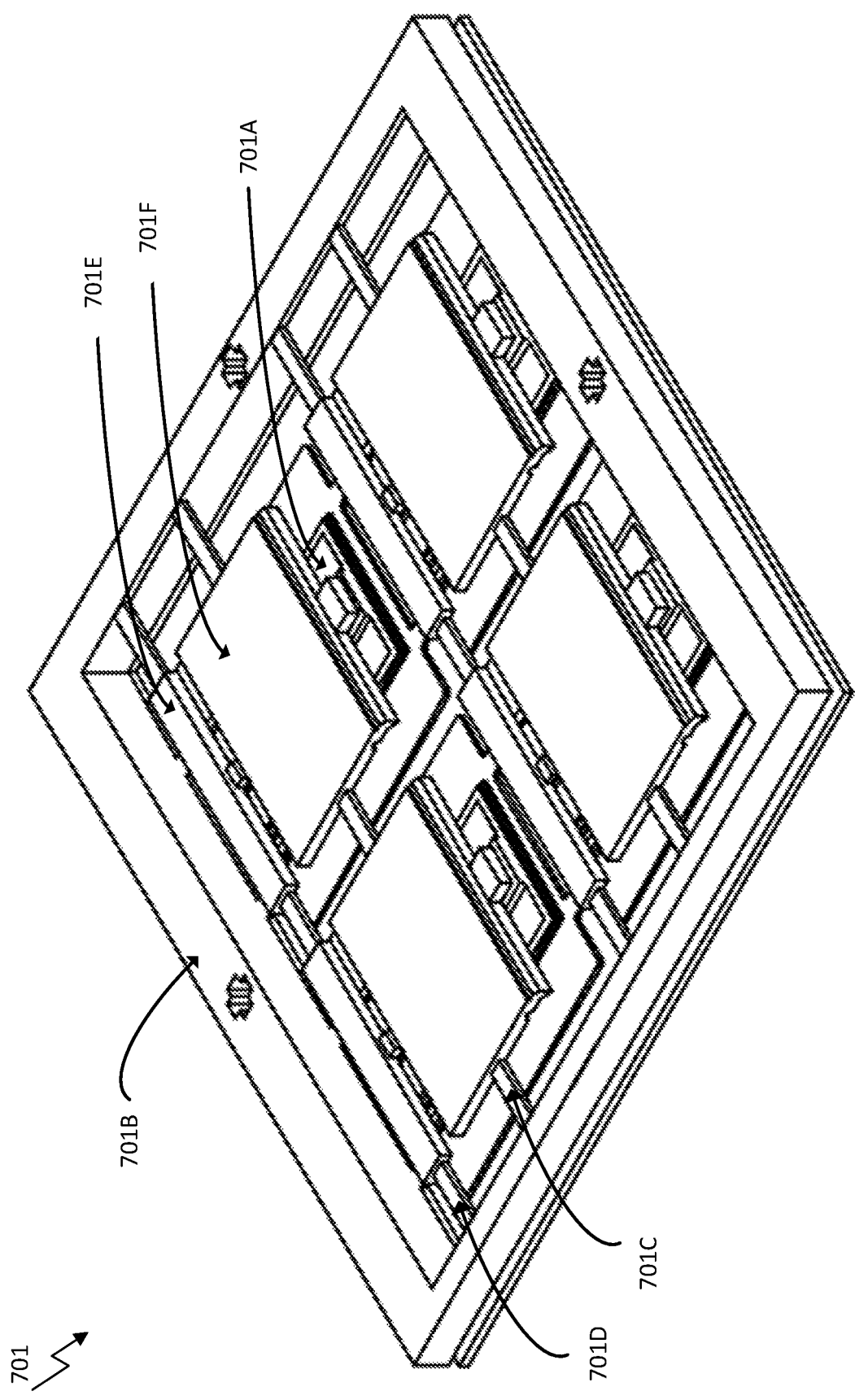

FIG. 7B shows a multi-assembly 701 that includes four unencapsulated chip stacks 701A mechanically connected in a unified leadframe 701B that includes tie bars between the stacks 701A and from the outer stacks to the edge of the leadframe 701B. A gate pad 701E and a source pad 701F are visible on top of each chip stack 701A. Gate tie bars 701D and source tie bars 701C are visible. Multi-assembly 701 is shown with four chip stacks 701A. In practice, a leadframe may designed to accommodate any number of chip stacks, as limited by available placement and alignment technology.

Figure 7C:
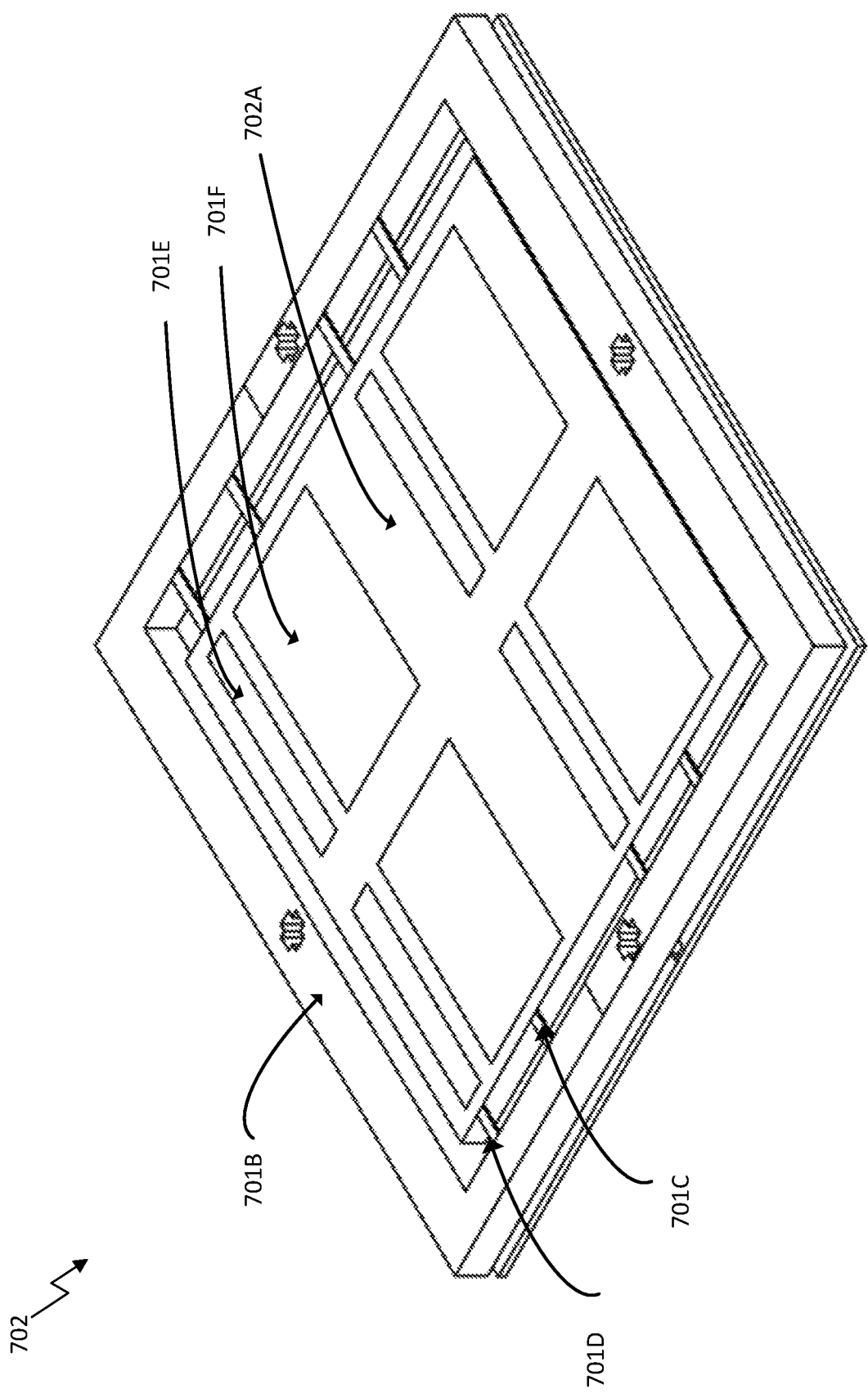

FIG. 7C shows a multi-assembly 702, which is multi-assembly 701 of FIG. 7B after adding encapsulant 702A. In the example of FIG. 7C, the top gate pads 701E and top source pads 701F of the four chip stacks are still exposed after encapsulation, as are the gate tie bars 701D, the source tie bars 701C, and the outer edge of the leadframe 701B.

Figure 7D:
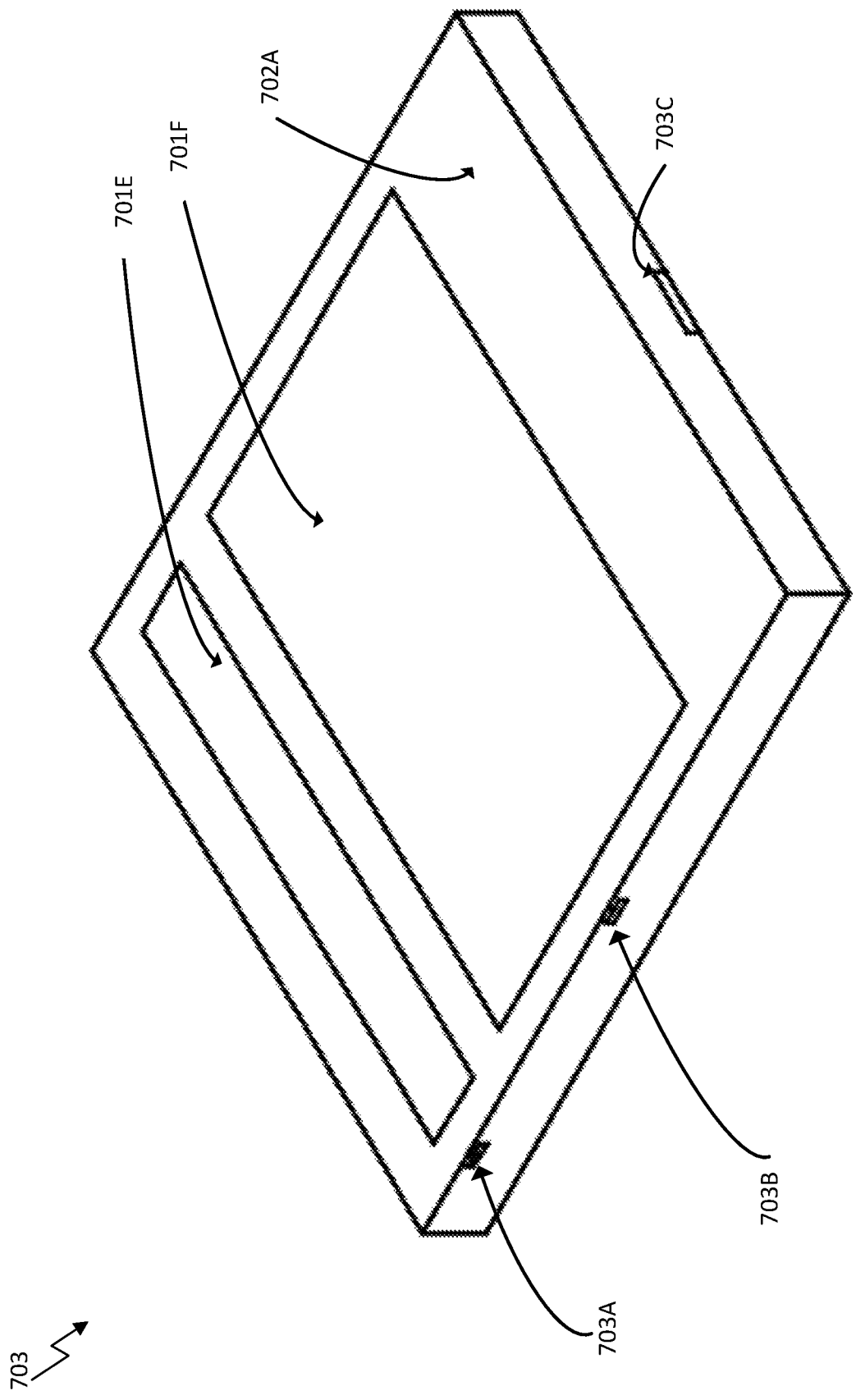
Figure 7E:
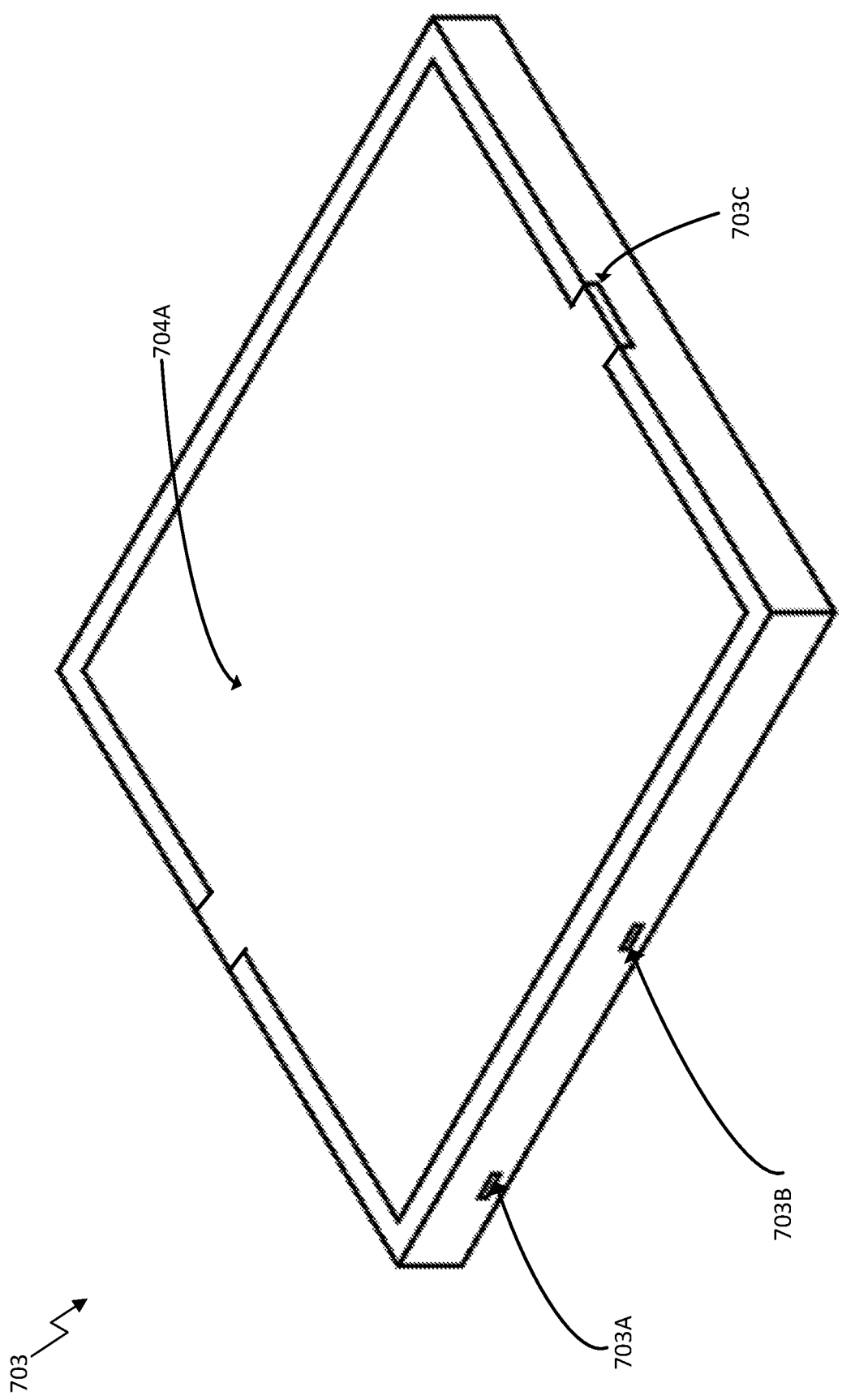

FIG. 7D shows a top view of an encapsulated chip stack assembly 703, which is one of the encapsulated chip stack assemblies after singulation from the multi-assembly 702 of FIG. 7C. In the example of FIG. 7D, ends of the tie bars for the cascode gate 703A, cascode source 703B, and cascode drain 703 are exposed on the sides of assembly 703. Otherwise, only the topside gate pad 701E, topside source pad 701F, and encapsulant 702A are visible. FIG. 7E shows a bottom view of chip stack assembly 703, revealing the bottom drain cascode connection.

Example Process without Exposed Topside Tie Bars

FIGS. 8A-F illustrate an alternate process for creating multiple chip stack assemblies. The process of FIGS. 8A-F is analogous to the process illustrated in FIGS. 7A-E. For purposes of illustration, the process is again described in terms of creating cascode devices like those in FIGS. 4A and 4B using chip stacks like those in FIG. 1A connected as in FIG. 1B. Again, as in FIGS. 4A and 7A-E, a multilevel connector structure is used to planarize a topside connection to two chip pads at different heights. Here in FIGS. 8A-F, a different leadframe structure is used, as compared to the example of FIGS. 7A-E, such that the chip stack assemblies do not have side tie bars exposed for the cascode gate and source on the sides of the chip stack assembly. This provides a greater distance from the drain at the bottom of the assembly to the gate and source topside connections, which is beneficial in avoiding arcing during high voltage testing, for example.

Further, the method illustrated in FIGS. 8A-F allows the gate and source of one chip stack to be isolated from those of other chip stacks before singulation. That is, each chip stack assembly may be electrically isolated from each other prior to being mechanically singulated. This allows for parallel testing of the devices in situ via their topside connections prior to singulations, which may significantly reduce testing time and cost.

Alternatively, using this method, a leadframe may be devised to connect sets of chip stack assemblies in parallel within the leadframe, but isolate sets from each other. This allows parallel testing of multiple separate sets of chip stack assemblies simultaneous, prior to mechanical singulation of the sets.

Figure 8A:
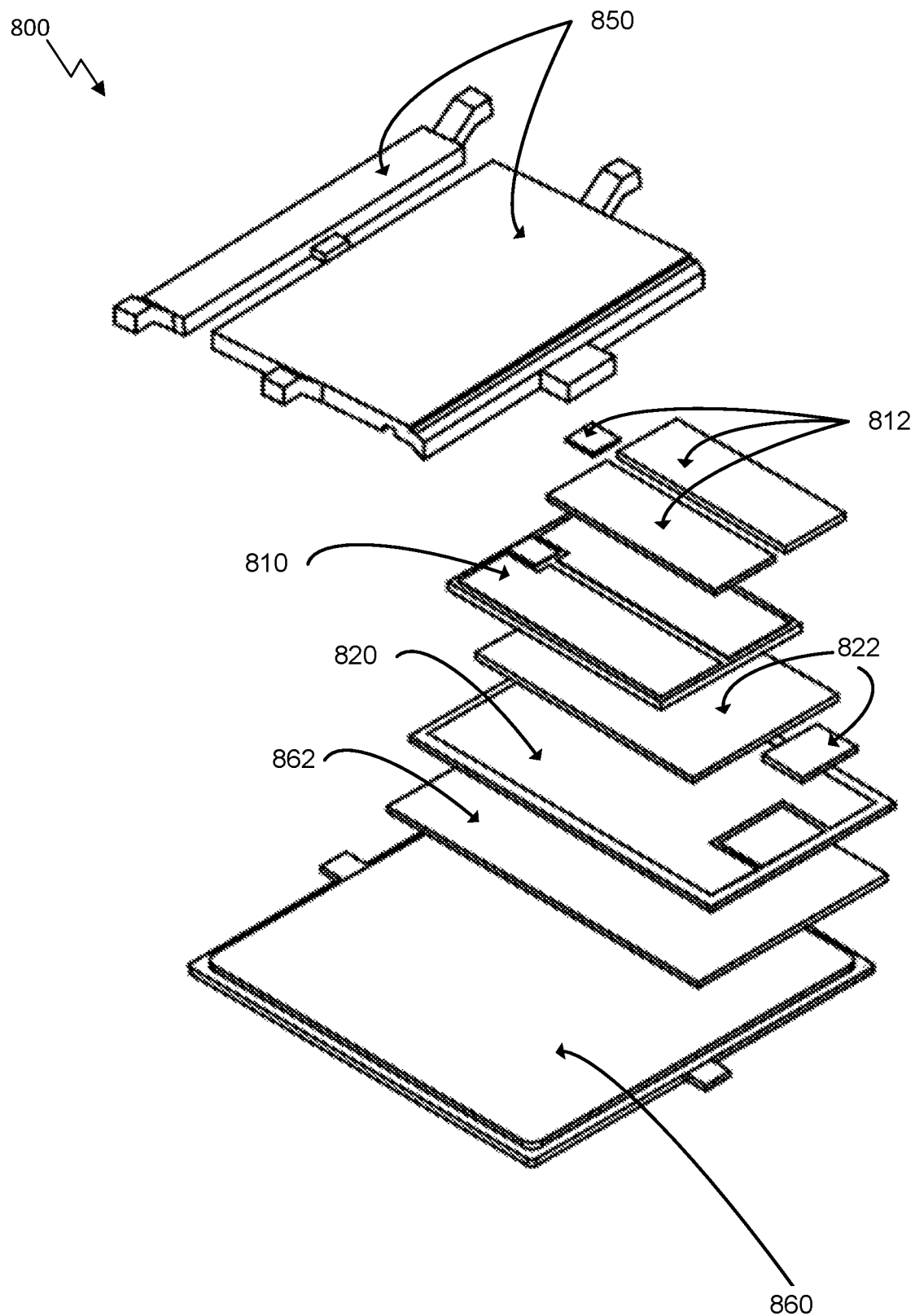
FIGS. 8A-8F illustrate an example process for building an array of chip stack assemblies without side tie bars.

FIG. 8A shows an exploded view of a chip stack 800 that is analogous to chip stack 700 of FIG. 7A. In the example of FIG. 8A, however, the tie bars of the top leadframe 850 shift up from the plane of the cascode gate and source pads. The rest is similar to the example of FIG. 7A. In FIG. 8A, the top leadframe 850 is connected to the MOS chip 810 by connecting material 812, and the top leadframe 850 and the MOS chip 810 are connected to the JFET chip 820 by connecting material 822. The JFET 820 is connected to the bottom leadframe 860 by connecting material 862.

Figure 8B:
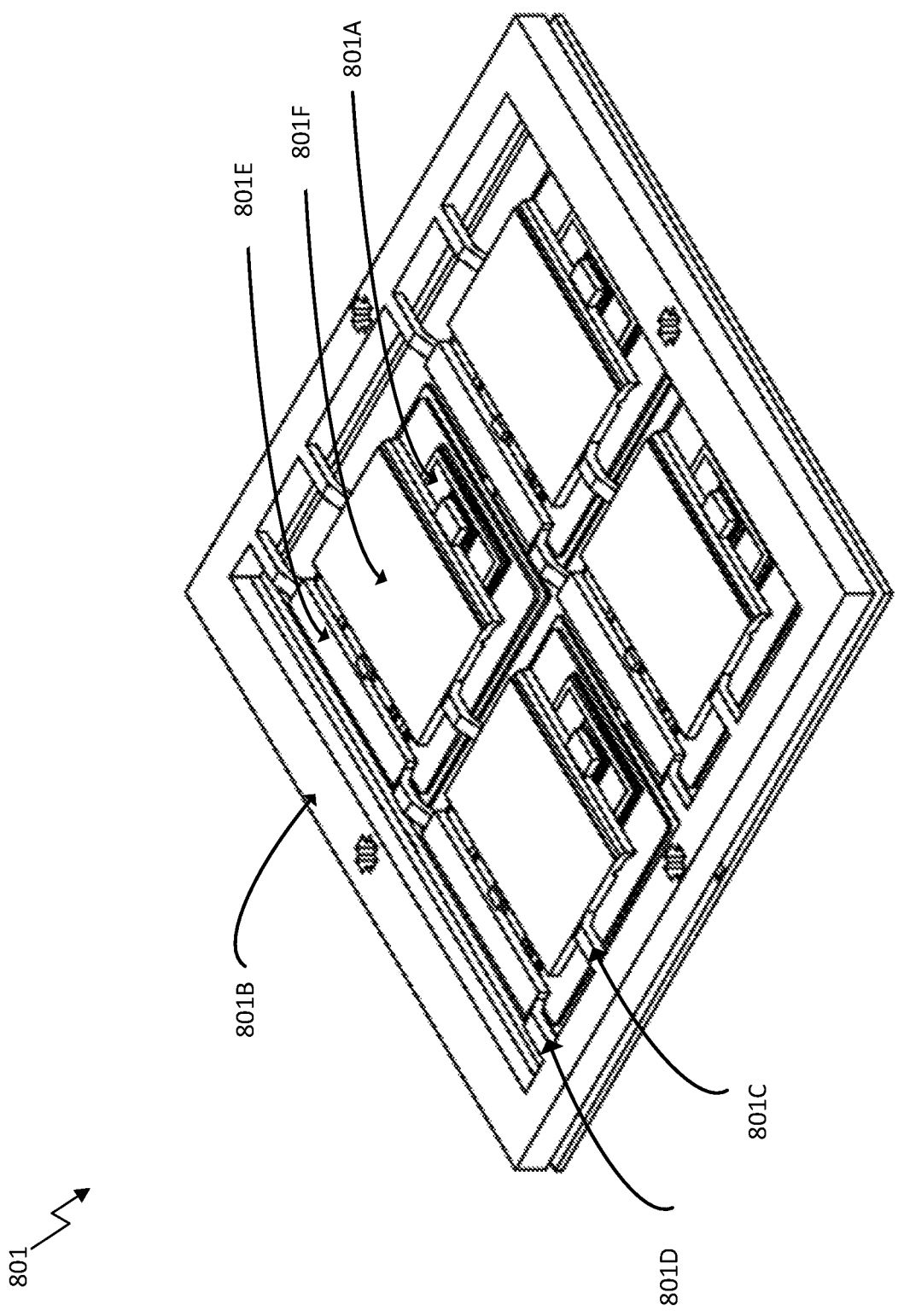

FIG. 8B shows a multi-assembly 801 that includes four unencapsulated chip stack assemblies 801A with topside gate pads 801E and topside source pads 801F. Multi-assembly 801 is analogous to multi-assembly 701 of FIG. 7B. However, here in FIG. 8B, the topside tie bars, such as gate tie bar 801D arch upward between the chip stack assemblies 801A, and between the chip stack assemblies 801A and the edge of the leadframe 801B.

Figure 8C:
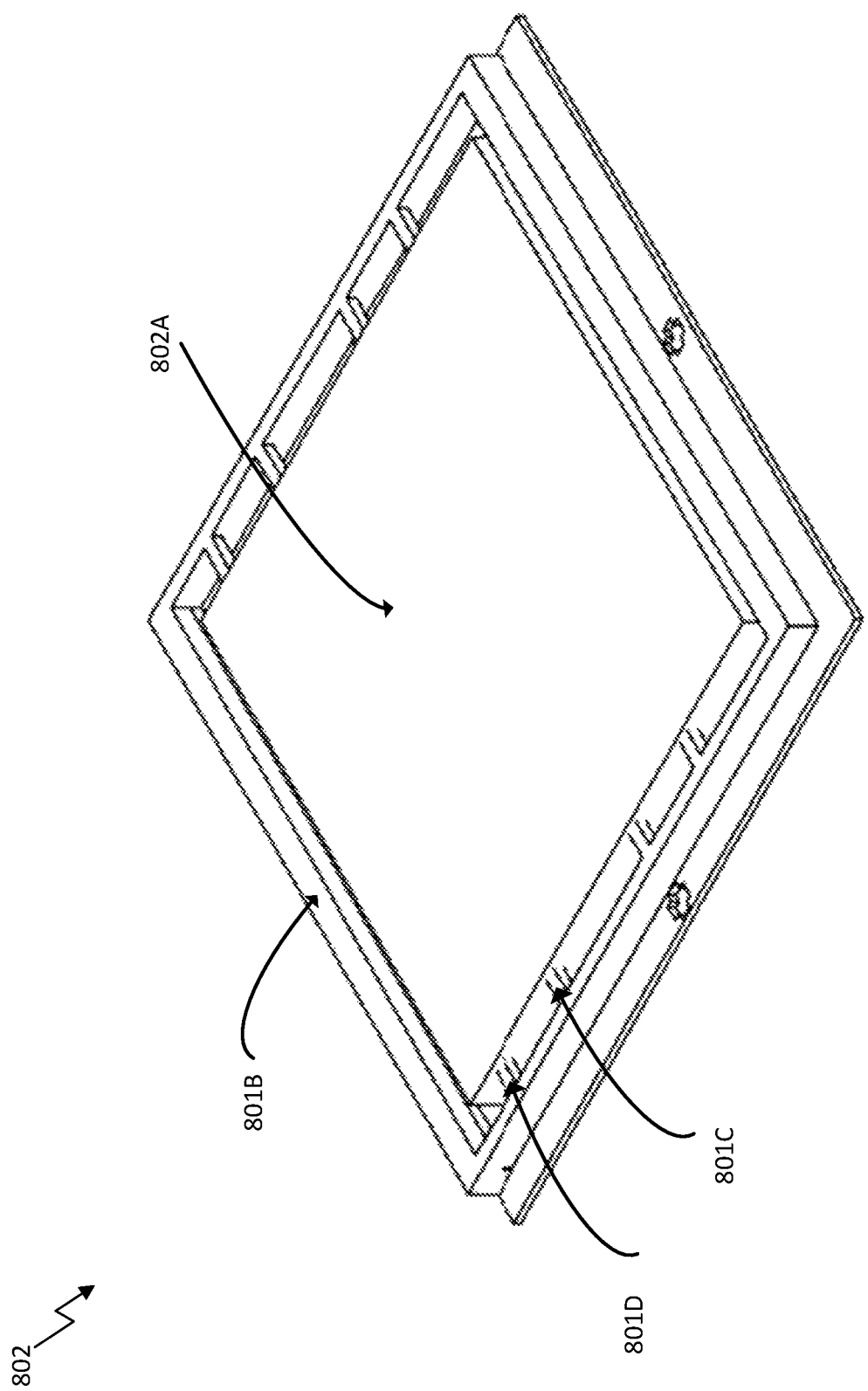

FIG. 8C shows a multi-assembly 802, which is the multi-assembly 801 of FIG. 8B after encapsulation. Some gate tie bars 801D and source tie bars 801C are visible at the edge of leadframe 801B. In contrast to multi-assembly 702 of FIG. 7C, in multi-assembly 802, the topside gate and source connection pads are not yet exposed, being covered with the encapsulant 802A dielectric material. Alternatively, of course, a mold may be devised to prevent this from happening, but the next step in the process is to grind away the top of the multi-assembly 802 to remove the raised portions of the tie bars. This will remove the excess encapsulant over the topside connections. It is simpler to mold the encapsulant initially to the full height of the leadframe structure.

Figure 8D:
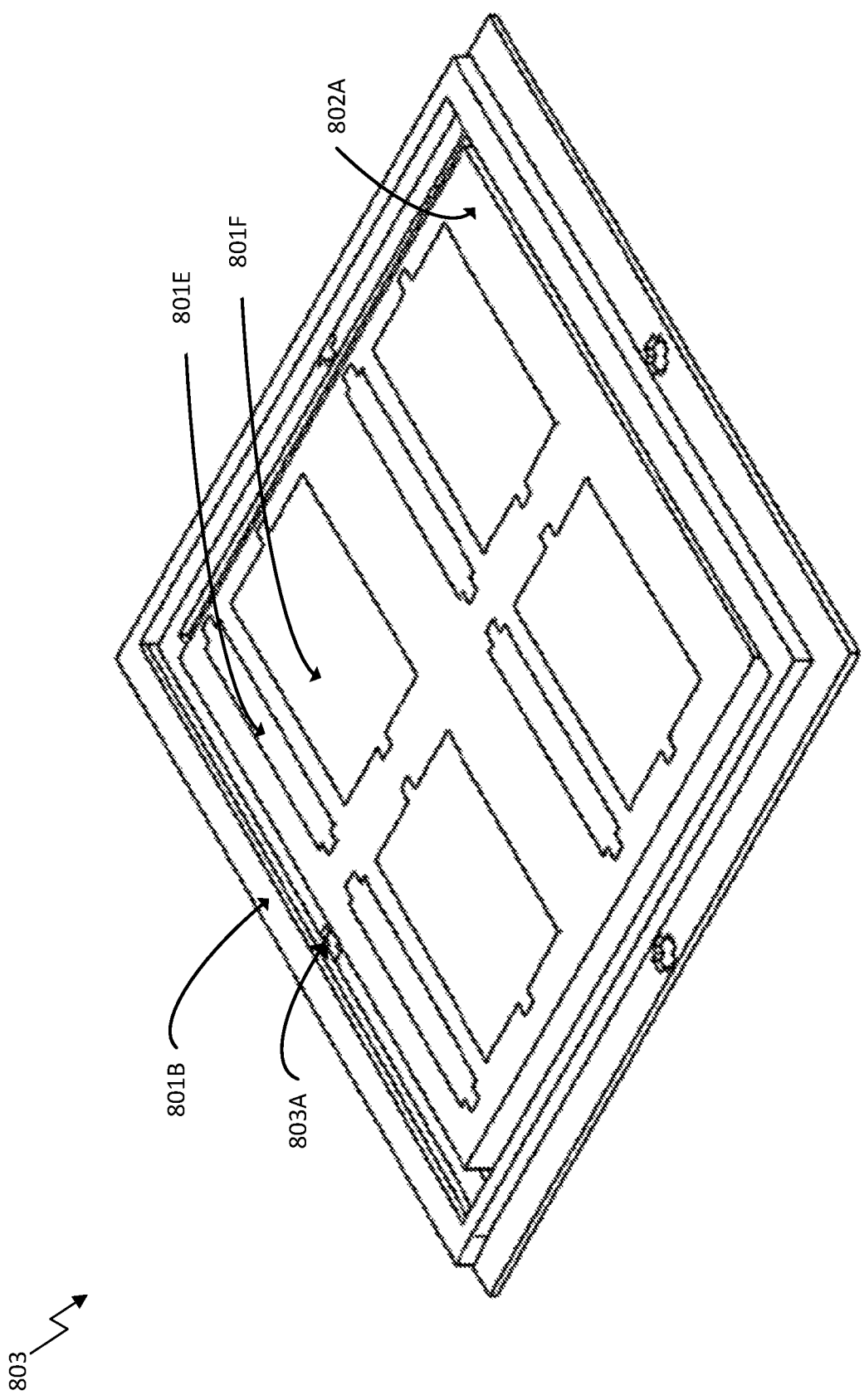

FIG. 8D shows multi-assembly 803, which is multi-assembly 802 of FIG. 8C after topside grinding. Topside gate pads 801E and topside source pads 801F of each chip stack are again visible after removal of a top portion of encapsulant 802A. Multi-assembly 803 is analogous to multi-assembly 702 of FIG. 7C. However, unlike multi-assembly 702, multi-assembly 803 lacks tie bars extending to the side for the topside gate and source connections. In this example, some drain level tie bars 803A remain to hold the center array of chip stacks in place within the leadframe 801B.

Figure 8E:
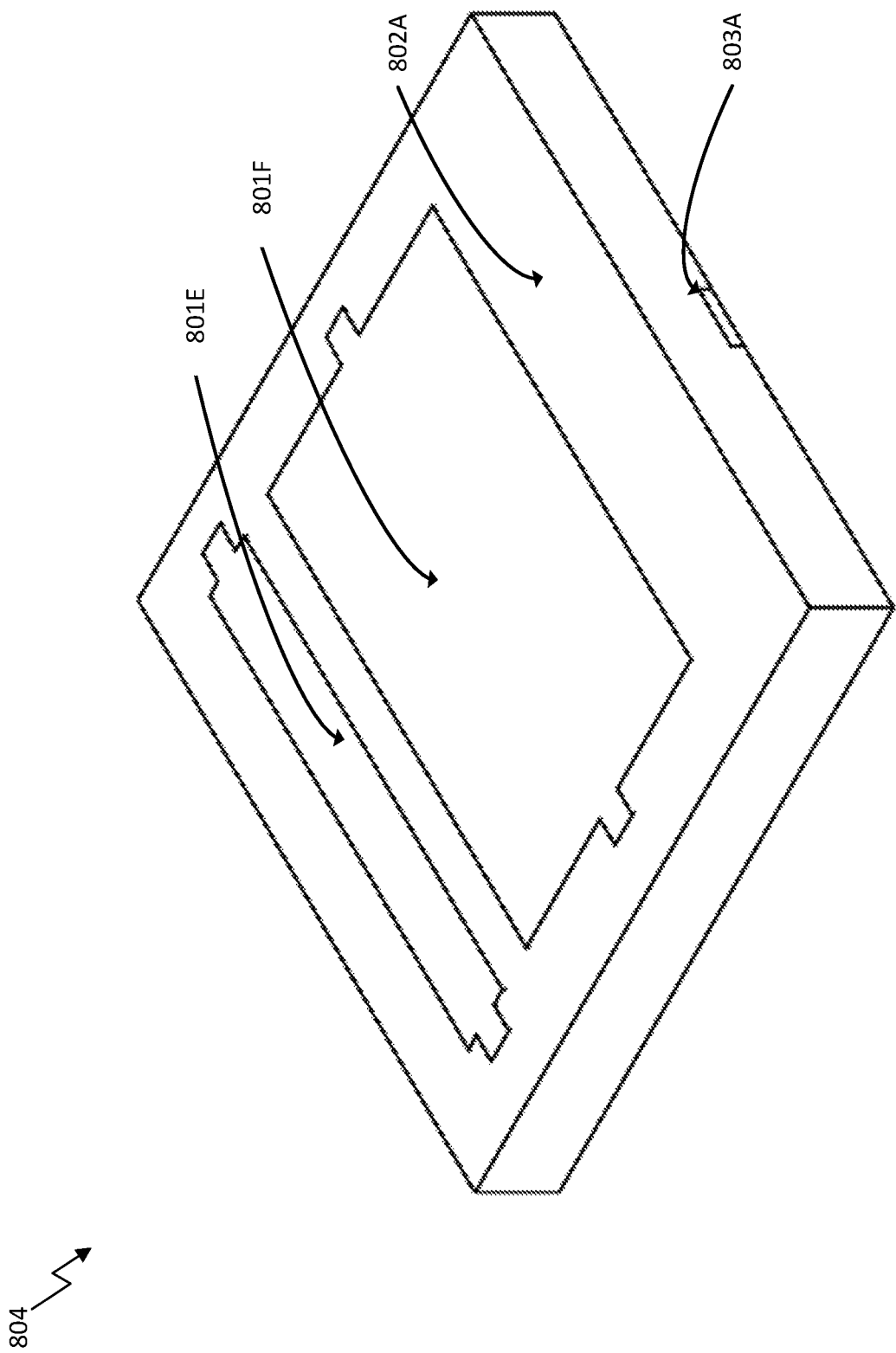
Figure 8F:
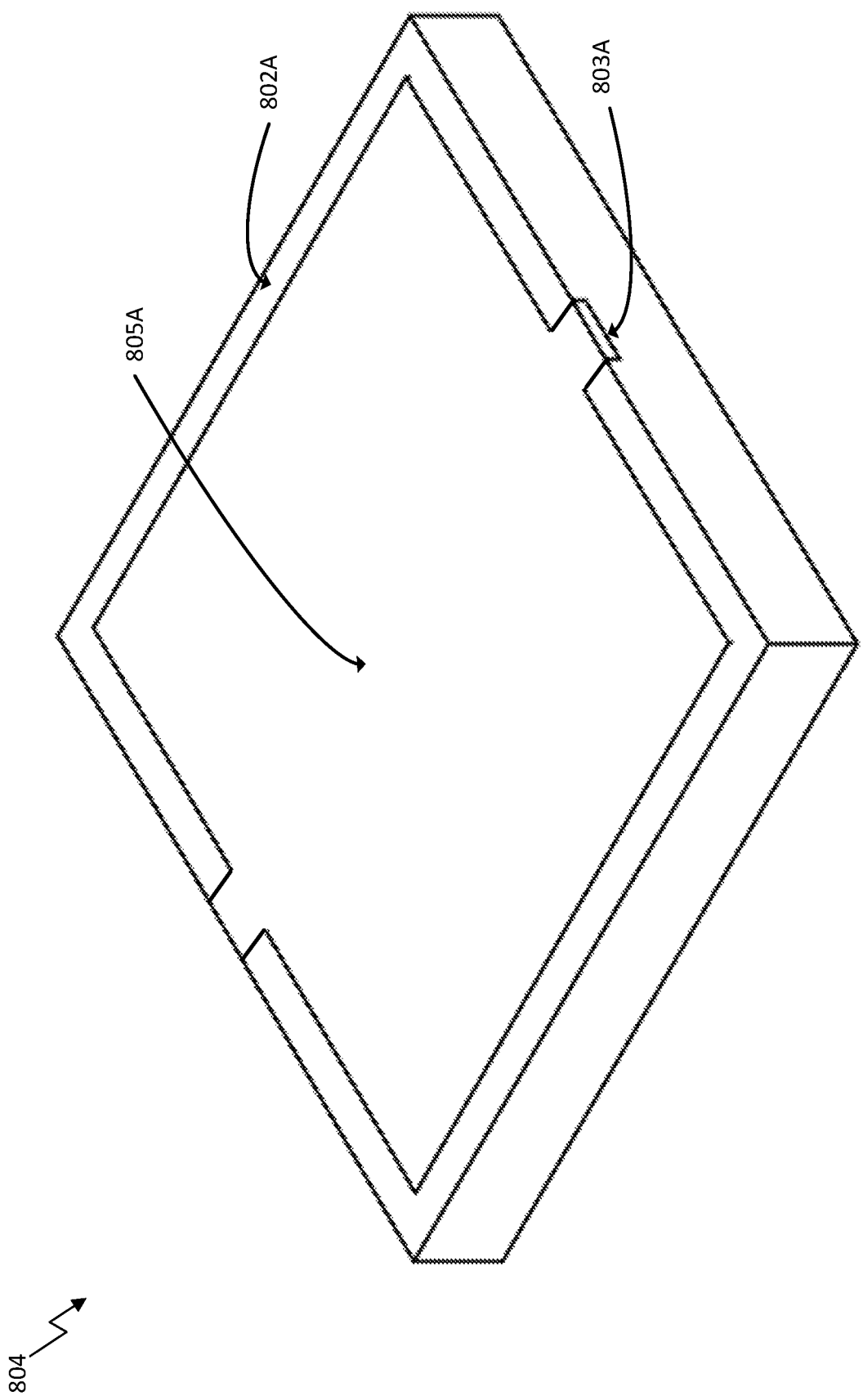

Singulated chip stack assembly 804 of FIG. 8E is one of the four chip stacks of multi-assembly 803 of FIG. 8C. Multi-assembly 803 is analogous to singulated chip stack assembly 703 of FIG. 7D, but without the side tie bars exposed for the topside gate and source connections. This is seen as well in FIG. 8F, which provides a bottom a view of singulated chip stack assembly 804, where the bottom drain pad 805A is visible.

Creepage Effect of Exposed Tie Bars

FIGS. 9A and 9B highlight a difference in results from approaches for the examples of FIGS. 7A-E and FIGS. 8A-F. FIG. 9A shows a cross-section chip stack assembly 703 of FIG. 7D taken where a topside tie bar 901 traverses the leadframe above the chips. Tie bar 901 is exposed on the sides of the assembly at a height above the plane of the assembly backside drain connection given as creepage distance 902. The creepage is measured to the side tie bar from the plane on which the drain is set, rather than from the drain contact itself, since it is expected that the assembly will be placed atop a drain conductor which extends to either side of the assembly.

FIG. 9B shows a cross-section chip stack assembly 804 of FIG. 8E taken where a topside tie bar 903 traverses the leadframe above the chips. Tie bar 903 is not exposed on the sides of the assembly. Therefore the creepage distance 904 of chip stack assembly 804 includes the full height of the chip stack assembly plus the distance from the edge of the chip stack assembly to topside gate or source pad, and is therefore longer than creepage distance 902 for the analogous assembly made with tie bars exposed at the side of the assembly.

We claim:

1. An assembly comprising a chip stack atop a heat spreader, a multilevel connector atop the chip stack, and an encapsulation, wherein:
   the chip stack comprises a top chip and a bottom chip;
   the top chip and the bottom chip are semiconductor devices;
   the top chip and the bottom chip each comprise a first and second topside connection pad and further comprise a single backside connection pad;
   the bottom chip is wider than the top chip;
   the backside connection pad of the top chip is bonded directly to the first topside connection pad of the bottom chip;
   the heat spreader is a monolithic metallic structure with a minimum vertical thickness of 0.1 mm;
   the backside connection pad of the bottom chip is bonded directly to a top surface of the heat spreader;
   a bottom surface of the heat spreader serves as a bottom connection surface of the assembly;
   the multilevel connector is a monolithic metallic structure with a minimum vertical thickness of 0.1 mm;
   the multilevel connector serves as a first topside connector, whereby a top surface of the multilevel connector serves as a first top connection surface of the assembly;
   a first bottom surface of the multilevel connector is bonded directly at a first height to the second topside connection pad of the top chip;
   a second bottom surface of the multilevel connector is bonded directly at a second height to the second topside connection pad of the bottom chip, such that the first topside connection pad of the top chip is connected to the second topside connector of the bottom chip via the multilevel connector; and
   the encapsulation covers the sides of the chip stack, leaving the first top connection surface of the assembly and the bottom connection surface of the assembly exposed.

2. The assembly of claim 1, further comprising a second topside connector wherein:
   the second topside connector is a monolithic metallic structure with a minimum vertical thickness of 0.1 mm;
   the second topside connector has a top side and a bottom side;
   the bottom side of the second topside connector is bonded directly to the first topside connection pad of the top chip;
   the top side of the second topside connector serves as a second top connection surface of the assembly; and
   the encapsulation leaves the second top connection of the surface of the assembly exposed.

3. The assembly of claim 2, wherein the multilevel connector, the second topside connector, and the header spreader comprise copper.

4. A power module, comprising an array of multiple instances of the assembly of claim 3, wherein the heat spreader of each assembly is a portion of a first contiguous metallic structure of the power module.

5. The power module of claim 4, wherein the multilevel connector of each assembly is a portion of a second contiguous metallic structure of the power module.

6. A power module, comprising an array of multiple instances of the assembly of claim 3, wherein the first top connection surface of each assembly is connected directly to a conductor of the power module via a solder bond, a sintered bond, a brazed bond, or a laser weld.

7. A power module, comprising an array of multiple instances of the assembly of claim 3, wherein the first top connection surface of each assembly is connected directly to a conductor of the power module via a spring clip.

8. A power module, comprising an array of multiple instances of the assembly of claim 3, wherein the first top connection surface of each assembly is connected directly to a conductor of the power module via one or more copper wire bonds.

9. A power module, comprising an array of multiple instances of the assembly of claim 3, wherein the first top connection surface of each assembly is connected directly to a conductor of the power module via one or more aluminum wire bonds, the aluminum wire bonds being formed used aluminum wire having a minimum diameter of 5 mils.

10. The assembly of claim 3, wherein an area of the first top connection surface of the assembly is larger than a total top area of the top chip.

11. The assembly of claim 10, wherein the area of the first top connection surface of the assembly is larger than a total top area of the bottom chip.

12. The assembly of claim 3, wherein:
    the assembly is a cascode;

the first top connection surface of the assembly is a source of the cascode;

the second top connection surface of the assembly is a gate of the cascode; and the bottom connection surface is a drain of the cascode.

13. The assembly of claim 12, wherein the top chip comprises a MOSFET and the bottom chip comprises a JFET.

14. The assembly of claim 13, wherein the top chip is a silicon semiconductor device and the bottom chip is a silicon carbide semiconductor device.

15. A method of forming a set of chip stack assemblies, comprising:

bonding a set of chip stacks to a heat spreader frame, wherein each chip stack of the set of chip stacks comprises a top chip and a bottom chip, the top chip and the bottom chip each comprising a first and a second topside connection pad and a single bottom connection pad, the bottom connection pad of the top chip being bonded directly to the first topside connection pad of the bottom chip;

bonding the set of chip stacks to a multilevel connector frame, wherein a portion of a first bottom connection surface of the multilevel connector frame is bonded to the second topside connection pad of each top chip at a first height, and a portion of a second bottom connection surface of the multilevel connector frame is bonded to the second topside connection pad of each bottom chip at a second height;

bonding a portion of a topside connector frame to the first topside connection pad of each top chip at the first height; and encapsulating the set of chip stacks such that side surfaces of the chip stacks are covered by an encapsulant.

16. The method of claim 15, wherein the heat spreader frame, the multilevel connector frame, and the topside connector frame are each a contiguous metallic structure comprising copper and having a vertical thickness of at least 0.1 mm.

17. The method of claim 16, further comprising separating the chip stacks by cutting vertically through portions of the multilevel connector frame and the topside connector frame between the chip stacks.

18. The method of claim 16, wherein the vertical cutting exposes portions of the multilevel connector frame and the topside connector frame through the encapsulation on sides of the chip stacks.

19. The method of claim 16, wherein portions of the multilevel connector frame between the chip stacks are raised above a top height of the multilevel connector frame and the topside connector frame over the chip stacks; and the method further comprising separating the chip stacks by horizontally cutting or grinding away the raised portions of the multilevel connector frame and the topside connector frame between the chip stacks that are raised above the top height of the multilevel connector frame and the topside connector frame over the chip stacks.

20. The method of claim 16, wherein bonding the set of chip stacks to the heat spreader frame comprises bonding a bonding a first bottom chip to the heat spreader frame and then bonding a first top chip to the first bottom chip, such that a first chip stack is formed in situ on the heat spreader frame.

* * * * *